(12) United States Patent
Tanzawa

(10) Patent No.: US 10,580,790 B2
(45) Date of Patent: Mar. 3, 2020

(54) SEMICONDUCTOR APPARATUS WITH MULTIPLE TIERS, AND METHODS

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/645,635

(22) Filed: Jul. 10, 2017

(65) Prior Publication Data

US 2017/0309641 A1 Oct. 26, 2017

Related U.S. Application Data

(62) Division of application No. 14/511,340, filed on Oct. 10, 2014, now Pat. No. 9,704,876, which is a division
(Continued)

(51) Int. Cl.
*H01L 29/74* (2006.01)
*H01L 27/11582* (2017.01)
(Continued)

(52) U.S. Cl.
CPC ........ *H01L 27/11582* (2013.01); *G11C 8/10* (2013.01); *H01L 21/02164* (2013.01);
(Continued)

(58) Field of Classification Search
CPC ......... H01L 21/02532; H01L 21/02164; H01L 27/11551; H01L 21/02595; G11C 8/10
See application file for complete search history.

(56) References Cited

U.S. PATENT DOCUMENTS 3,825,907 A 7/1974 Sell et al.
4,811,082 A 3/1989 Jacobs et al.
(Continued)

FOREIGN PATENT DOCUMENTS

CN 101853858 A 10/2010
CN 103620781 A 3/2014
(Continued)

OTHER PUBLICATIONS

"U.S. Appl. No. 14/511,340, Corrected Notice of Allowance dated Jun. 22, 2016", 2 pgs.
(Continued)

*Primary Examiner* — Samuel A Gebremariam
(74) *Attorney, Agent, or Firm* — Schwegman Lundberg & Woessner, P.A.

(57) ABSTRACT

Apparatus and methods are disclosed, including an apparatus that includes a number of tiers of a first semiconductor material, each tier including at least one access line of at least one memory cell and at least one source, channel and/or drain of at least one peripheral transistor, such as one used in an access line decoder circuit or a data line multiplexing circuit. The apparatus can also include a number of pillars of a second semiconductor material extending through the tiers of the first semiconductor material, each pillar including either a source, channel and/or drain of at least one of the memory cells, or a gate of at least one of the peripheral transistors. Methods of forming such apparatus are also described, along with other embodiments.

13 Claims, 21 Drawing Sheets

Related U.S. Application Data of application No. 13/096,822, filed on Apr. 28, 2011, now Pat. No. 8,860,117.

(51) Int. Cl.

| | |
|---|---|
| *H01L 27/11524* | (2017.01) |
| *H01L 27/11531* | (2017.01) |
| *H01L 27/11556* | (2017.01) |
| *H01L 27/1157* | (2017.01) |
| *H01L 27/11573* | (2017.01) |
| *G11C 8/10* | (2006.01) |
| *H01L 21/02* | (2006.01) |
| *H01L 27/11529* | (2017.01) |
| *H01L 29/49* | (2006.01) |

(52) U.S. Cl.
CPC .. *H01L 21/02532* (2013.01); *H01L 21/02595* (2013.01); *H01L 27/1157* (2013.01); *H01L 27/11524* (2013.01); *H01L 27/11529* (2013.01); *H01L 27/11531* (2013.01); *H01L 27/11556* (2013.01); *H01L 27/11573* (2013.01); *H01L 29/495* (2013.01); *H01L 29/4966* (2013.01)

(56) References Cited

U.S. PATENT DOCUMENTS

| | | | |
|---|---|---|---|
| 5,732,018 | A | 3/1998 | Choi |
| 5,805,498 | A | 9/1998 | Lee et al. |
| 6,621,735 | B2 | 9/2003 | Nakamura et al. |
| 7,554,832 | B2 | 6/2009 | Fasoli et al. |
| 7,852,676 | B2 | 12/2010 | Maejima |
| 7,859,902 | B2 | 12/2010 | Maejima |
| 8,681,555 | B2 | 3/2014 | Liu |
| 8,709,894 | B2 | 4/2014 | Lee et al. |
| 8,860,117 | B2 | 10/2014 | Tanzawa |
| 8,964,474 | B2 | 2/2015 | Morooka et al. |
| 8,984,214 | B2 | 3/2015 | Chen et al. |
| 9,076,528 | B2 | 7/2015 | Porterfield |
| 9,128,637 | B2 | 9/2015 | Manning |
| 9,152,512 | B2 | 10/2015 | Cronin et al. |
| 9,165,653 | B2 | 10/2015 | Asnaashari et al. |
| 9,170,898 | B2 | 10/2015 | Porterfield |
| 9,679,650 | B1 | 6/2017 | Sakui |
| 9,704,876 | B2 | 7/2017 | Tanzawa |
| 2005/0226049 | A1 | 10/2005 | Jeong et al. |
| 2006/0126397 | A1 | 6/2006 | Tanishima |
| 2006/0146608 | A1 | 7/2006 | Fasoli et al. |
| 2006/0203547 | A1 | 9/2006 | Takeuchi |
| 2007/0161162 | A1 | 7/2007 | Jeng |
| 2007/0252201 | A1 | 11/2007 | Kito et al. |
| 2008/0099819 | A1 | 5/2008 | Kito et al. |
| 2008/0303083 | A1 | 12/2008 | Oyu |
| 2009/0161474 | A1 | 6/2009 | Scheuerlein et al. |
| 2009/0168534 | A1 | 7/2009 | Park et al. |
| 2009/0224330 | A1 | 9/2009 | Hong et al. |
| 2009/0267139 | A1 | 10/2009 | Maejima |
| 2009/0268522 | A1 | 10/2009 | Maejima |
| 2009/0268524 | A1 | 10/2009 | Maejima |
| 2010/0109071 | A1 | 5/2010 | Tanaka et al. |
| 2010/0177566 | A1 | 7/2010 | Kim et al. |
| 2010/0181612 | A1 | 7/2010 | Kito et al. |
| 2010/0207185 | A1 | 8/2010 | Lee et al. |
| 2010/0207186 | A1 | 8/2010 | Higashi et al. |
| 2010/0226195 | A1 | 9/2010 | Lue |
| 2010/0238732 | A1 | 9/2010 | Hishida et al. |
| 2010/0270529 | A1 | 10/2010 | Lung |
| 2010/0270593 | A1 | 10/2010 | Lung et al. |
| 2010/0314678 | A1 | 12/2010 | Lim et al. |
| 2010/0315881 | A1 | 12/2010 | Kim et al. |
| 2010/0320526 | A1 | 12/2010 | Kidoh et al. |
| 2010/0320528 | A1 | 12/2010 | Jeong et al. |
| 2010/0321984 | A1 | 12/2010 | Rahim et al. |
| 2010/0321998 | A1 | 12/2010 | Jang |
| 2010/0322000 | A1 | 12/2010 | Shim et al. |
| 2010/0327339 | A1* | 12/2010 | Tanaka .............. H01L 27/11573 257/324 |
| 2011/0013454 | A1 | 1/2011 | Hishida et al. |
| 2011/0049611 | A1 | 3/2011 | Kiyotoshi et al. |
| 2011/0063916 | A1 | 3/2011 | Maeda |
| 2011/0169071 | A1 | 7/2011 | Uenaka et al. |
| 2011/0182105 | A1 | 7/2011 | Yan et al. |
| 2011/0216603 | A1 | 9/2011 | Han et al. |
| 2011/0286283 | A1 | 11/2011 | Lung et al. |
| 2012/0273862 | A1 | 11/2012 | Tanzawa |
| 2013/0336065 | A1 | 12/2013 | Morooka et al. |
| 2015/0021609 | A1 | 1/2015 | Tanzawa |
| 2015/0162084 | A1 | 6/2015 | Morooka et al. |
| 2018/0358096 | A1 | 12/2018 | Sakui |

FOREIGN PATENT DOCUMENTS

| | | |
|---|---|---|
| JP | 2001298194 A | 10/2001 |
| JP | 2009212280 A | 9/2009 |
| JP | 2010114113 A | 5/2010 |
| JP | 2010165794 A | 7/2010 |
| JP | 2010166055 A | 7/2010 |
| JP | 2010187001 A | 8/2010 |
| KR | 20060100993 A | 9/2006 |
| KR | 20100003629 A | 1/2010 |
| KR | 1020100003629 A | 1/2010 |
| TW | 200710851 A | 3/2007 |
| TW | 201308577 A | 2/2013 |
| TW | 201407630 A | 2/2013 |
| TW | I524356 B | 3/2016 |
| TW | 201612899 A | 4/2016 |
| WO | WO-2012149424 A2 | 11/2012 |
| WO | WO-2012149424 A3 | 11/2012 |
| WO | WO-2013188399 A1 | 12/2013 |

OTHER PUBLICATIONS

"U.S. Appl. No. 14/511,340, Notice of Allowance dated Mar. 14, 2017", 8 pgs.

"U.S. Appl. No. 14/511,340, Notice of Allowance dated Jun. 8, 2016", 8 pgs.

"U.S. Appl. No. 14/511,340, Notice of Allowance dated Sep. 28, 2016", 9 pgs.

"U.S. Appl. No. 14/511,340, Preliminary Amendment filed Dec. 29, 2016", 5 pgs.

"U.S. Appl. No. 14/625,540, Response filed Aug. 17, 2016 to Non Final Office Action dated May 17, 2016", 8 pgs.

"U.S. Appl. No. 14/626,540, Advisory Action dated Nov. 25, 2016", 2 pgs.

"U.S. Appl. No. 14/626,540, Final Office Action dated Jun. 1, 2017", 9 pgs.

"U.S. Appl. No. 14/626,540, Final Office Action dated Sep. 16, 2016", 9 pgs.

"U.S. Appl. No. 14/626,540, Non Final Office Action dated Feb. 2, 2017", 9 pgs.

"U.S. Appl. No. 14/626,540, Response filed May 2, 2017 to Non Final Office Action dated Feb. 2, 2017", 9 pgs.

"U.S. Appl. No. 14/626,540, Response filed Nov. 16, 2016 to Final Office Action dated Sep. 16, 2016", 11 pgs.

"U.S. Appl. No. 15/148,408, Non Final Office Action dated Oct. 14, 2016", 7 pgs.

"U.S. Appl. No. 15/148,408, Notice of Allowance dated Feb. 14, 2017", 7 pgs.

"U.S. Appl. No. 15/148,408, Response filed Jan. 17, 2017 to Non Final Office Action dated Oct. 14, 2016", 30 pgs.

"Chinese Application Serial No. 201280028890.6, Response filed Jul. 5, 2016 to Office Action dated Apr. 21, 2016", W/ English Claims, 27 pgs.

"Korean Application Serial No. 10-2013-7031681, Office Action dated Jun. 29, 2017", W/ English Translation, 34 pgs.

"Taiwanese Application Serial No. 101115256, Decision of Rejection dated May 9, 2016", W/ English Translation, 6 pgs.

(56) References Cited

OTHER PUBLICATIONS

"Taiwanese Application Serial No. 1041143893, Response filed May 22, 2017 to Office Action dated Feb. 18, 2017", w/English Translation, 36 pgs.
"Taiwanese Application Serial No. 104143893, Office Action dated Feb. 18, 2017", w/ Translation, 13 pgs.
"Chinese Application Serial No. 201280028890.6, Office Action dated Apr. 21, 2016"W/ English Translation, 12 pgs.
"Chinese Application Serial No. 201280028890.6, Office Action dated Oct. 12, 2015", W/ English Translation, 8 pgs.
"Chinese Application Serial No. 201280028890.6, Response filed Jan. 4, 2016 to Office Action dated Oct. 12, 2015", W/ English Claims, 26 pgs.
"European Application Serial No. 12776549.3, Response filed Mar. 10, 2015 to Extended European Search Report dated Mar. 10, 2015", 18 pgs.
"European Application Serial No. 12776549.3, Communication under Rule 71(3) dated Mar. 31, 2016", 59 pgs.
"European Application Serial No. 12776549.3, Extended European Search Report dated Oct. 14, 2014", 6 pgs.
"European Application Serial No. 12776549.3, Preliminary Amendment filed Jun. 11, 2014", 9 pgs.
"International Application Serial No. PCT/US2012/035596, International Preliminary Report on Patentability dated Nov. 7, 2013", 8 pgs.
"International Application Serial No. PCT/US2012/035596, International Search Report dated Jan. 10, 2013", 5 pgs.
"International Application Serial No. PCT/US2012/035596, Invitation to Pay Additional Fees and Partial Search Report dated Nov. 26, 2016", 7 pgs.
"International Application Serial No. PCT/US2012/035596, Written Opinion dated Jan. 10, 2013", 6 pgs.
"International Application Serial No. PCT/US2013/045173, International Preliminary Report on Patentability dated Dec. 24, 2014", 8 pgs.
"International Application Serial No. PCT/US2013/045173, International Search Report dated Sep. 26, 2013", 3 pgs.
"International Application Serial No. PCT/US2013/045173, Written Opinion dated Sep. 2013", 6 pgs.
"Janpanese Application Serial No. 2014-508138, Non Final Office Action dated Oct. 13, 2015", W/ English Translation, 10 pgs.
"Janpanese Application Serial No. 2014-508138, Response Filed Jan. 7, 2016 to Non Final Office Action dated Oct. 13, 2015", W/ Machine Translated Amendments, 7 pgs.
"Japanese Application Serial No. 2014-508138, Office Action dated May 19, 2015", W/ Machine Translation, 9 pgs.
"Japanese Application Serial No. 2014-508138, Response filed Aug. 10, 2015 to Office Action dated May 19, 2015", W/ English Claims, 14 pgs.
"Korean Application Serial No. 10-2013-7031681, Office Action dated Jun. 29, 2017", W/ English Tranlsation, 34 pgs.
"Taiwanese Application Serial No. 101115256, Amendment filed Apr. 9, 2015", W/ English Claims only (no Original filed).
"Taiwanese Application Serial No. 101115256, Office Action dated Sep. 14, 2015", W/ English Translation, 7 pgs.
"Taiwanese Application Serial No. 101115256, Response filed Mar. 15, 2016 to Office Action dated Sep. 14, 2015", (English Translation of Claims), 38 pgs.
"Taiwanese Application Serial No. 102121223, Office Action dated Aug. 13, 2015", W/ English Translation, 3 pgs.
"Taiwanese Application Serial No. 102121223, Response filed Nov. 12, 2015 to Office Action dated Aug. 13, 2015", W/ English Claims, 14 pgs.
"Taiwanese Application Serial No. 102121223, Supplemental Voluntary Amendment filed Jul. 2, 2015", W/ English Claims, 7 pgs.
"Taiwanese Application Serial No. 102121223, Voluntary Amendment filed Apr. 3, 2014", W/ English Claims, 36 pgs.
"Taiwanese Application Serial No. 1041143893, Response filed May 22, 2017 to Office Action dated Feb. 18, 2017", 36 pgs.

Chiang, M H, et al., "Novel High-Density Low-Power Logic Circuit Techniques Using DG Devices", IEEE ED, 52(10), (2005), 2339-42.
Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.
Jang, J., et al,, "Vertical cell array using TCAT(Terabit Cell Array Transistor) technology for ultra high density NAND flash memory", Symposium on VLSI Technology, (2009), 192-193.
Johnson, Mark, et al,, "512-Mb PROM with a three-dimensional array of diode/antifuse memory cells", IEEE Journal of Solid-State Circuits, 38(11), (2003), 1920-1928.
Katsumata, R., et al., "Pipe-shaped BiCS flash memory with 16 stacked layers and multi-level-cell operation for ultra high density storage devices", Symposium on VLSI Technology, (Jun. 2009), 136-37.
Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.
Kim, W., et al., "Multi-layered Vertical Gate NAND Flash overcoming stacking limit for terabit density storage", Symposium on VLSI Technology, (2009), 188-89.
Park, Ki-Tate, et al., "A 7MB/s 64Gb 3-Bit/Cell DDR NAND Flash Memory in 20nm-Node Technology", ISSCC 2011 / SESSION 11 / Non-Volatile Memory Solutions / 11.8, 2011 IEEE International Solid-State Circuits Conference (Digest of Technical Papers), (Feb. 22, 2011), 212-213.
Sakui, K, et al., "Design Impacts on NAND Flash Memory Core Circuits with Vertical MOSFETs", IEEE International Memory Workshop (IMW), (May 2010), 1-4.
Tanaka, H., et al., "Bit Cost Scalable Technology with Punch and Plug Process for Ultra High Density Flash Memory", IEEE Symposium on VLSI Technology, (2007), 14-15.
U.S. Appl. No. 13/096,822, Restriction Requirement dated Jul. 25, 2013, 8 pgs.
U.S. Appl. No. 13/096,822, Response filed Aug. 26, 2013 to Restriction Requirement dated Jul. 25, 2013, 11 pgs.
U.S. Appl. No. 13/096,822, Non Final Office Action dated Nov. 21, 2013, 18 pgs.
U.S. Appl. No. 13/096,822, Response filed Feb. 21, 2014 to Non Final Office Action dated Nov. 21, 2013, 13 pgs.
U.S. Appl. No. 13/096,822, Notice of Allowance dated Jun. 6, 2014. 10 pgs.
U.S. Appl. No. 13/524,872, Non Final Office Action dated Dec. 6, 2013, 19 pgs.
U.S. Appl. No. 13/524,872, Response filed May 6, 2014 to Non Final Office Action dated Dec. 6, 2013, 15 pgs.
U.S. Appl. No. 13/524,872, Final Office Action dated Jul. 24, 2014, 12 pgs.
U.S. Appl. No. 13/524,872, Response filed Sep. 24, 2014 to Final Office Action dated Jul. 24, 2014, 14 pgs.
U.S. Appl. No. 13/524,872, Notice of Allowance dated Oct. 16, 2014, 9 pgs.
U.S. Appl. No. 14/511,340, Restriction Requirement dated Sep. 17, 2015, 7 pgs.
U.S. Appl. No. 14/511,340, Response filed Nov. 17, 2015 to Restriction Requirement dated Sep. 17, 2015, 4 pgs.
U.S. Appl. No. 14/511,340, Ex Parte Quayle Action dared Dec. 17, 2015, 9 pgs.
U.S. Appl. No. 14/511,340, Ex Parte Quayle Action Response filed Feb. 17, 2016, 7 pgs.
U.S. Appl. No. 14/626,540, Non Final Office Action dated May 17, 2016, 11 pgs.
"Korean Application Serial No. 10-2013-7031681, Response filed Nov. 28, 2017 for Office Action dated Jun. 29, 2017", with English translation of current claims, 31 pgs.
"Chinese Application Serial No. 201710001454.4, Office Action dated Jul. 30, 2018", W/ English Translation, 12 pgs.
U.S. Appl. No. 13/096,822 U.S. Pat. No. 8,850,117, filed Apr. 28, 2011, Semiconductor Apparatus With Multiple Tiers of Memory Cells With Peripheral Transistors, and Methods.

(56) References Cited

OTHER PUBLICATIONS

U.S. Appl. No. 14/511,340 U.S. Pat. No. 9,704,876, filed Oct. 10, 2014, Semiconductor Apparatus With Multiple Tiers, and Methods.
U.S. Appl. No. 15/148,408 U.S. Pat. No. 9,679,650, filed May 6, 2016, 3D NAND Memory Z-Decoder.
U.S. Appl. No. 16/606,493, filed May 26, 2017, 3D NAND Memory Z-Decoder.
U.S. Appl. No. 16/107,357, filed Aug. 21, 2018, 3D NAND Memory Z-Decoder.
"Chinese Application Serial No. 201710001454.4, Office Action dated May 23, 2019", w/English Translation, 22 pgs.
"Chinese Application Serial No. 201710001454.4, Response Filed Feb. 14, 2019 to Office Action dated Jul. 30, 2018", w/English Claims, 18 pgs.
"Korean Application Serial No. 10-2018-7015490, Notice of Preliminary Rejection dated Feb. 27, 2019", w/English Translation, 20 pgs.
"Korean Application Serial No. 10-2018-7015490, Response filed May 23, 2019 to Notice of Preliminary Rejection dated Feb. 27, 2019", w/ English Claims, 17 pgs.
"Korean Application Serial No. 10-2018-7015490, Korean Final Office Action dated Sep. 23, 2019", W English Translation, 7 pgs.
"Chinese Application Serial No. 201710001454.4, Office Action dated Sep. 27, 2019", w English Translation, 8 pgs.

\* cited by examiner

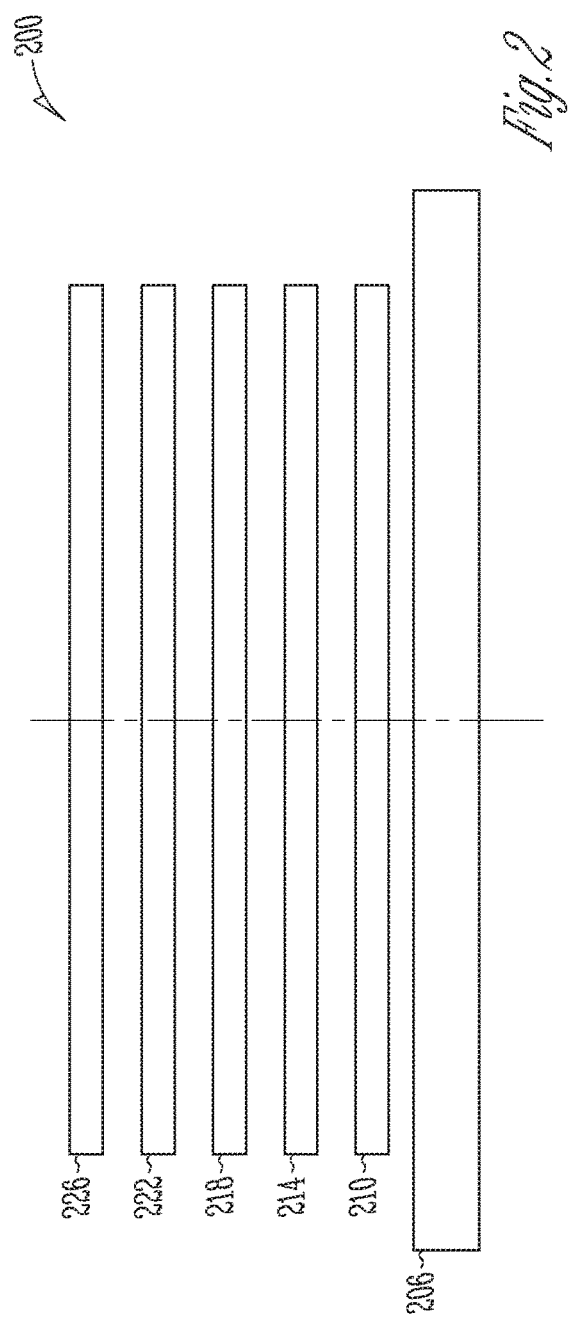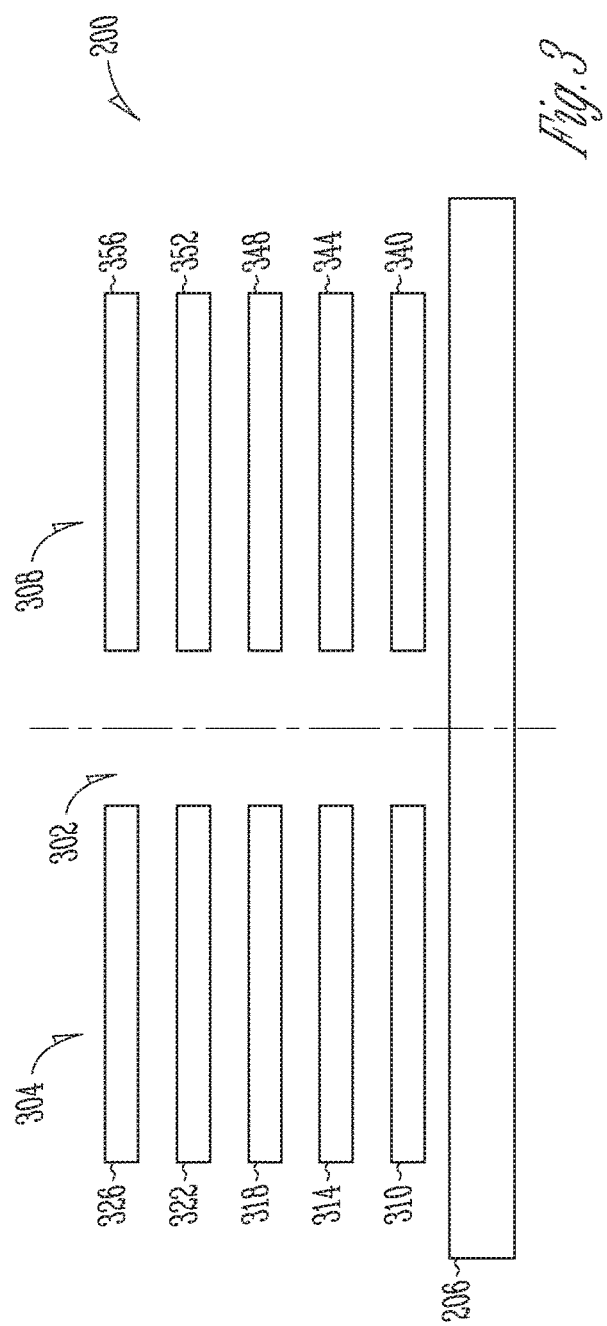

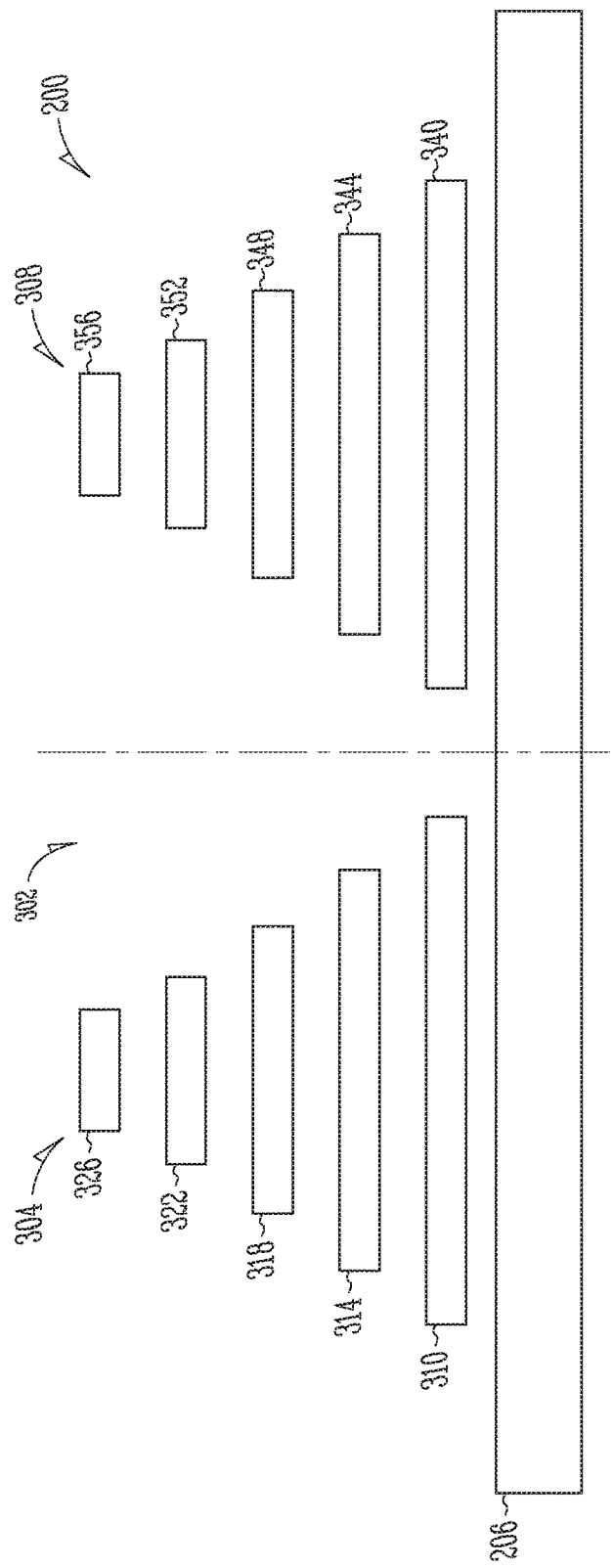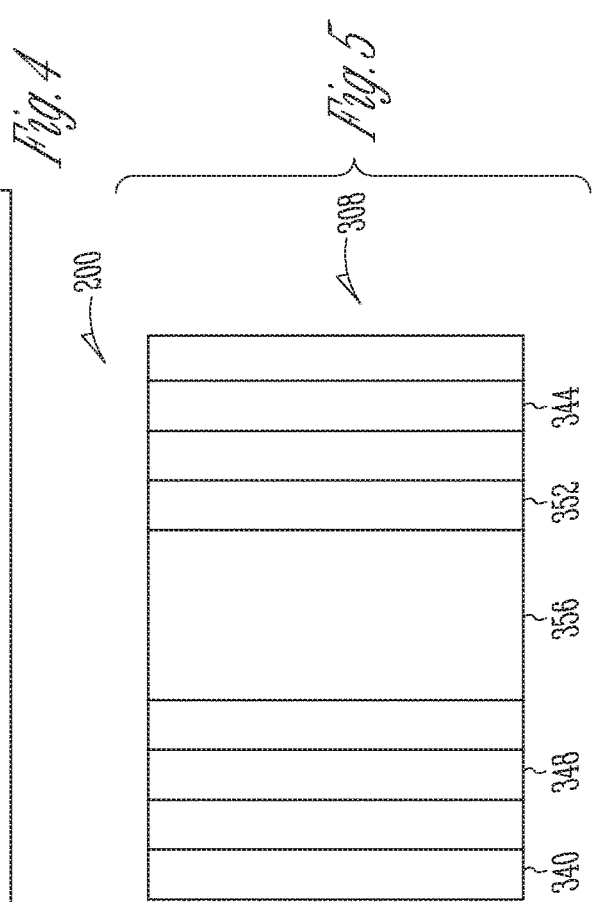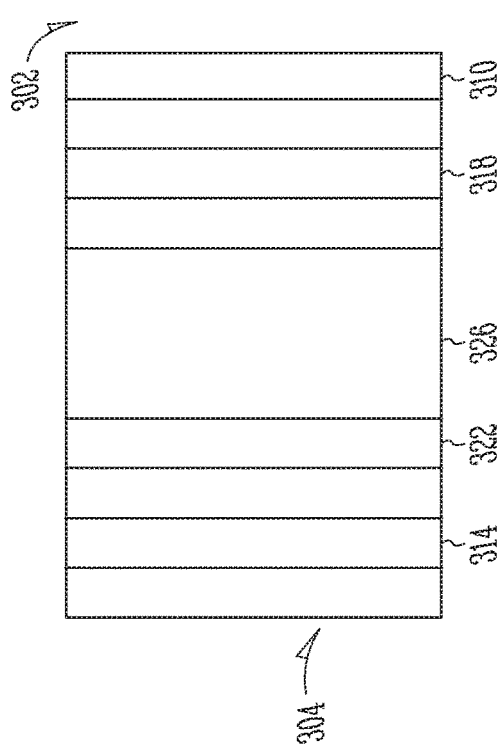

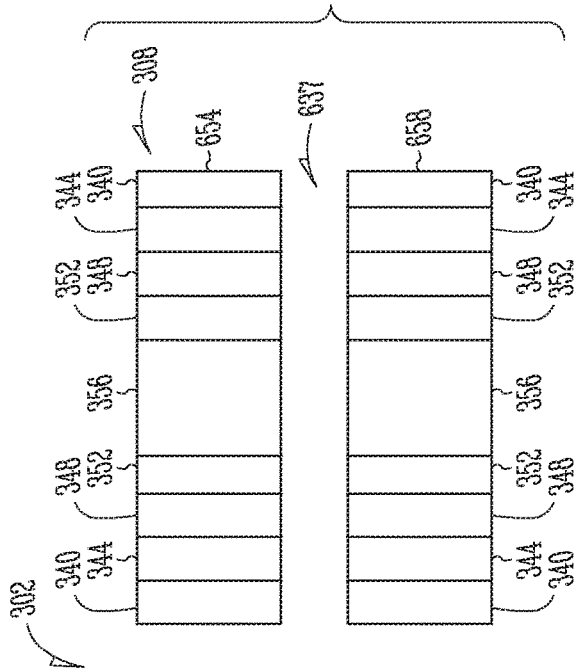
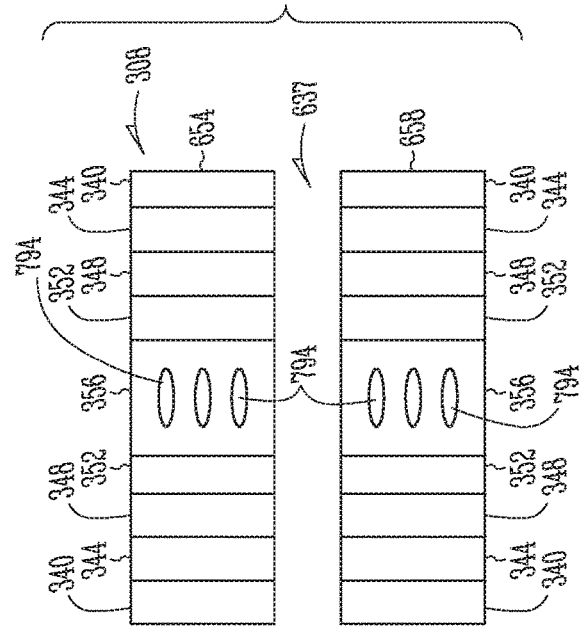
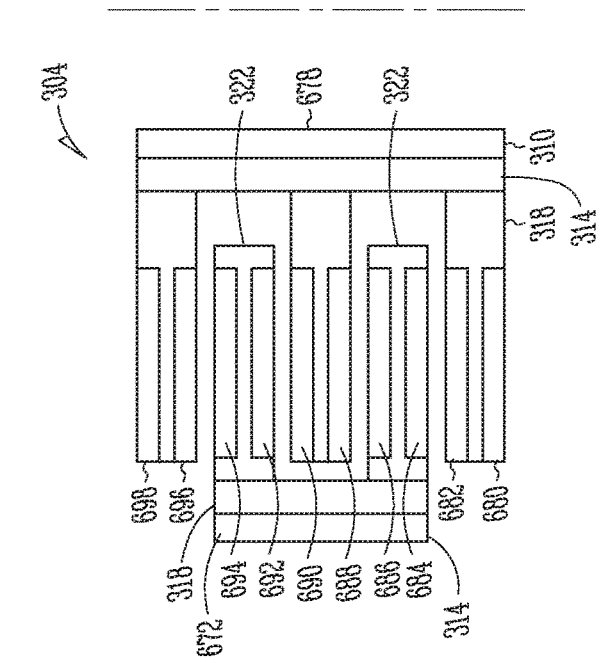
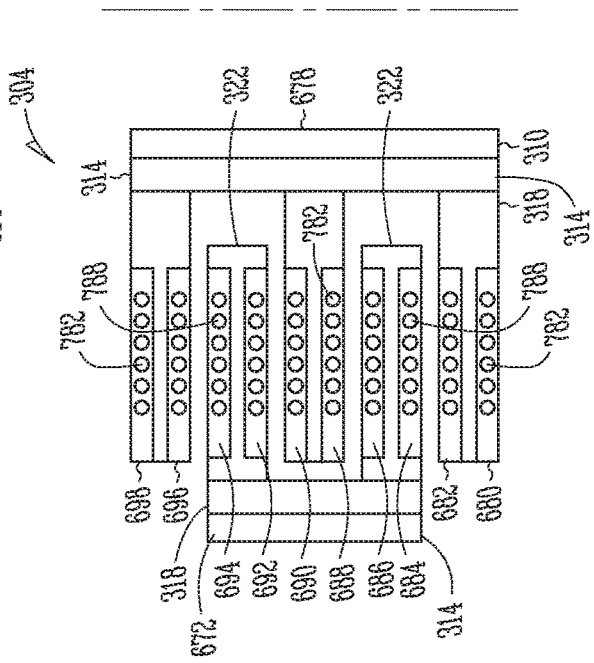
Fig. 6
Fig. 7

SEMICONDUCTOR APPARATUS WITH MULTIPLE TIERS, AND METHODS

PRIORITY APPLICATION

This application is a divisional of U.S. application Ser. No. 14/511,340, filed Oct. 10, 2014, which is a divisional of U.S. application Ser. No. 13/096,822, filed Apr. 28, 2011, now issued as U.S. Pat. No. 8,860,117, all of which are incorporated herein by reference in their entirety.

BACKGROUND

Semiconductor constructions with multiple tiers are used in many electronic devices such as personal digital assistants (PDAs), laptop computers, mobile phones and digital cameras. Some of these semiconductor constructions have arrays of charge storage transistors.

BRIEF DESCRIPTION OF THE DRAWINGS

Some embodiments are illustrated by way of example and not limitation in the figures of the accompanying drawings in which:

FIG. 2 is a front view of a semiconductor construction according to various embodiments of the invention:

FIG. 3 is a front view of a semiconductor construction according to various embodiments of the invention;

FIG. 4 is a front view of a semiconductor construction according to various embodiments of the invention:

FIG. 5 is a top view of a semiconductor construction according to various embodiments of the invention;

FIG. 6 is a top view of a semiconductor construction according to various embodiments of the invention;

FIG. 7 is a top view of a semiconductor construction according to various embodiments of the invention;

DETAILED DESCRIPTION

The density of components in three-dimensional semiconductor devices continually increases with the competition for increasing sales of the devices. The inventor has discovered that the challenge noted above, as well as others, can be addressed by fabricating, in each tier of a plurality of tiers of semiconductor material, at least a respective portion of a respective first device and at least a portion of a respective second device. For example, a portion of a three-dimensional transistor for a peripheral circuit, such as an access line decoder circuit or a data line multiplexing circuit, and a portion of a three-dimensional memory cell are fabricated in the same tier of semiconductor material of a memory device. The resulting memory device can provide an increased density of memory cells without significant additional processing events to fabricate the transistors of at least one peripheral circuit.

Figure 1:
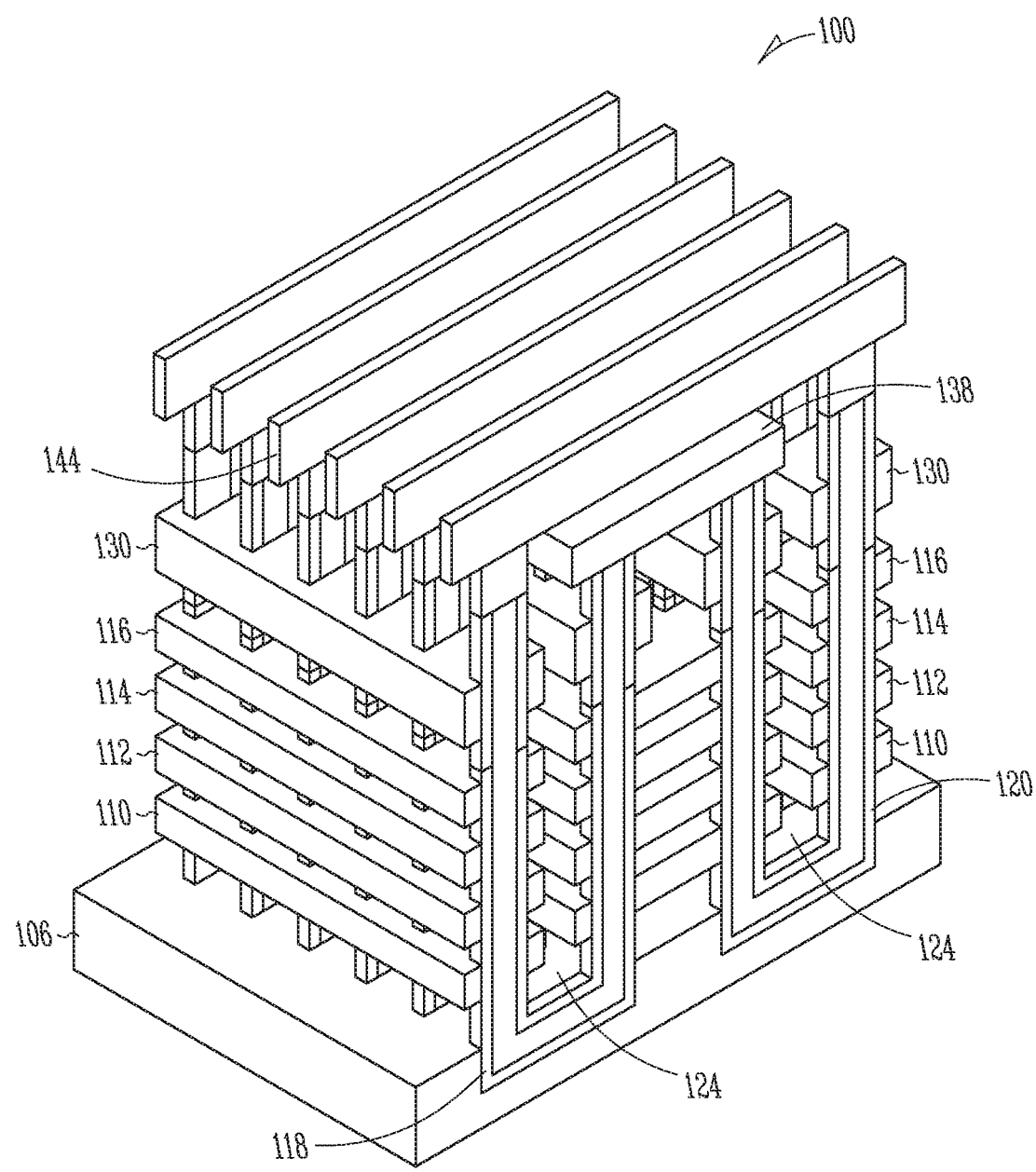
FIG. 1 is a three-dimensional view of a semiconductor memory device according to various embodiments of the invention.

FIG. 1 is a three-dimensional view of a semiconductor memory device 100 according to various embodiments of the invention. The memory device 100 can be formed on a substrate 106 and includes multiple tiers of semiconductor material that include access lines 110, 112, 114 and 116 that at least partially surround charge storage structures (e.g., floating gates) of charge storage transistors. For the purposes of this document, a "tier of semiconductor material" can mean semiconductor material formed in a same plane, rank, row, or unit, such as in a horizontal or vertical or sloped plane, row, rank or unit of a structure. Two U-shaped pillars 118 and 120 are formed in the device 100 and can function as channels for the charge storage transistors. The U-shaped pillars 118 and 120 can extend into the substrate 106. Vertical slots 124 separate charge storage transistors and their access lines 110, 112, 114 and 116 that at least partially surround each U-shaped pillar 118 and 120. Each U-shaped pillar 118 and 120 comprises a semiconductor material such as silicon or polysilicon (e.g., a tube of silicon or polysilicon with a core, where the core may be filled with air or a dielectric material). A single tier of select gates 130 surround select transistors formed at both ends of each of the U-shaped pillars 118 and 120. Source lines 138 are formed on the select transistors at first ends of the U-shaped pillars 118 and 120. Data lines 144 are formed on the select transistors at second ends of the U-shaped pillars 118 and 120. The tiers of semiconductor material including the access lines 110, 112, 114 and 116 may also each function as a body of a peripheral transistor, such as a decoder transistor. The U-shaped pillars 118 and 120 may comprise a semiconductor material that also functions as gate of a peripheral transistor as shown and described with reference to the following FIGS. 2-16.

FIG. 2 is a front view of the semiconductor construction 200 according to various embodiments of the invention. The same tiers and regions in the semiconductor construction 200 will be identified by the same reference numerals throughout FIGS. 2-10 for purposes of brevity and clarity. The semiconductor construction 200 can be formed on a semiconductor (e.g., silicon) substrate 206. Tiers of a semiconductor material such as n-type polysilicon are deposited alternately with a dielectric (not shown) on the substrate 206. The tiers of semiconductor material include first 210, second 214, third 218, fourth 222 and fifth 226 tiers. The dielectric may be, for example, silicon dioxide that is used to separate the tiers of semiconductor material 210, 214, 218, 222 and 226 from each other and the substrate 206. The tiers of semiconductor material 210, 214, 218, 222 and 226 (referred to hereinafter by example as tiers of polysilicon) are in a stacked arrangement. The semiconductor construction 200 may include, for example, even numbers, such as 8, 16, 24, 32, 40, 48 or more, of tiers of polysilicon formed alternately with the dielectric. Although the embodiments discussed herein involve tiers of n-type polysilicon, the tiers of polysilicon may alternatively be undoped or p-type polysilicon according to various embodiments of the invention.

FIG. 3 is a front view of the semiconductor construction 200 according to various embodiments of the invention. A vertical slot 302 is etched through the tiers 210, 214, 218, 222 and 226 to divide the semiconductor construction 200 into, for example, a left-hand construction 304 and a right-hand construction 308. The left-hand construction 304 and the right-hand construction 308 may be different in size and/or the construction 200 may be further divided into additional constructions. For example, the left-hand construction 304 may comprise about seventy to eighty percent of the semiconductor construction 200 while the right-hand construction 308 may comprise about five percent of the semiconductor construction 200. The vertical slot 302 is large enough for interconnect lines (e.g., wires) to be formed between the left-hand construction 304 and the right-hand construction 308. The left-hand construction 304 includes first portions 310, 314, 318, 322 and 326 of the tiers 210, 214, 218, 222, and 226, respectively, while the right-hand construction includes second portions 340, 344, 348, 352 and 356 of the tiers 210, 214, 218, 222, and 226, respectively.

FIG. 4 is a front view of the semiconductor construction 200 according to various embodiments of the invention. The left-hand construction 304 and the right-hand construction 308 are each formed (e.g., etched) into a staircase configuration. As a result, the first portion 310 is longer than the first portion 314, the first portion 314 is longer than the first portion 318, the first portion 318 is longer than the first portion 322 and the first portion 322 is longer than the first portion 326 of the tiers 210, 214, 218, 222, and 226, respectively, in the left-hand construction 304. The second portion 340 is longer than the second portion 344, the second portion 344 is longer than the second portion 348, the second portion 348 is longer than the second portion 352 and the second portion 352 is longer than the second portion 356 of the tiers 210, 214, 218, 222, and 226, respectively, in the right-hand construction 308.

FIG. 5 is a top view of the semiconductor construction 200 described with respect to FIG. 4.

FIG. 6 is a top view of the semiconductor construction 200 according to various embodiments of the invention. The left-hand construction 304 and the right-hand construction 308 are formed into an array of memory cells and peripheral transistors, respectively, such as by different etch activities. A vertical slot 637 can be etched through the right-hand construction 308 to leave, for example, a first decoder block 654 and a second decoder block 658. The left-hand construction 304 can be etched into a first set of fingers 672 and a second set of fingers 678 that are interdigitally arranged. The first set of fingers 672 and the second set of fingers 678 are separated from each other such that each of the first portions 310, 314, 318, 322 and 326 of the tiers 210, 214, 218, 222, and 226, respectively, are separated into two parts. Each separate part of each first portion 310, 314, 318 and 322 can function as an access line for a memory cell. Less than all of the first portions 310, 314, 318, 322 and 326 of the tiers 210, 214, 218, 222, and 226, respectively, are shown in FIG. 6 for purposes of brevity and clarity.

Polysilicon from the first portions 314, 318 and 322 of the tiers 214, 218 and 222, respectively, is shown in the first set of fingers 672. Polysilicon from the first portions 310, 314 and 318 of the tiers 210, 214, and 218, respectively, is shown in the second set of fingers 678. The polysilicon from the first portion 326 of the tier 226 is formed (e.g., etched) into elongated and substantially parallel select gates 680, 682, 684, 686, 688, 690, 692, 694, 696 and 698. Two of the select gates 680, 682, 684, 686, 688, 690, 692, 694, 696 and 698 are in each of the fingers of the first set of fingers 672 and the second set of fingers 678.

FIG. 7 is a top view of the semiconductor construction 200 according to various embodiments of the invention. Holes 782 are etched through the first portions 310, 314, 318, 322 and 326 of the tiers 210, 214, 218, 222, and 226, respectively, in the second set of fingers 678. Similar holes 788 are etched through the first portions 310, 314, 318, 322 and 326 of the tiers 210, 214, 218, 222, and 226, respectively, in the first set of fingers 672. The holes 782 and 788 are etched accommodate U-shaped pillars of a semiconductor material in the left-hand construction 304, and are approximately the same size in some embodiments of the invention.

Each of the second portions 340, 344, 348, 352 and 356 of the tiers 210, 214, 218, 222, and 226, respectively, in the first decoder block 654 and the second decoder block 658 of the right-hand construction 308 functions as a body (a source, a channel and/or a drain) of a decoder transistor that is to be coupled to an access line of a memory cell or a select gate. Multiple holes 794 are etched through all of the second portions 340, 344, 348, 352 and 356 of the tiers 210, 214, 218, 222, and 226, respectively, in each of the first decoder block 654 and the second decoder block 658 to accommodate pillars (e.g., of polysilicon material) that can function as gates of multi-gate decoder transistors. The holes 794 may be formed separately and/or larger than the holes 782 and/or 788 in the left-hand construction 304, such as to provide for higher driving current in the decoder transistors. Some or all of the decoder transistors of the right-hand construction 308 may also be single-gate decoder transistors. The holes 794 in the right-hand construction 308 may also be substantially the same size and/or may be formed at substantially the same time as the holes 782 or 788 in the left-hand construction 304 according to various embodiments of the invention.

Figure 8:
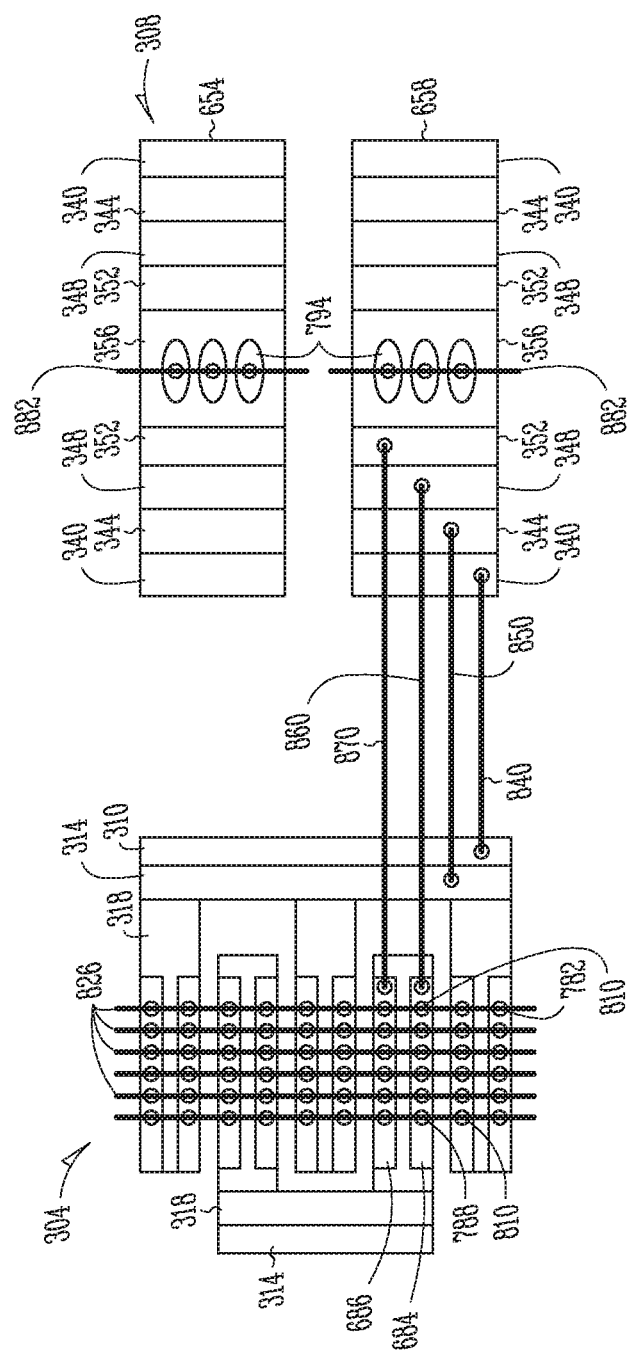
FIG. 8 is a top view of a semiconductor construction according to various embodiments of the invention.

FIG. 8 is a top view of the semiconductor construction 200 according to various embodiments of the invention. Memory cell transistors in the left-hand construction 304 include charge storage structures (e.g., charge traps or floating gates) that are formed in the holes 782 and 788. The memory cell transistors may be formed by depositing an inter-poly dielectric, a storage element such as floating gate and silicon nitride (SiN), a tunnel oxide and a polysilicon layer in the left-hand construction 304 while the right-hand construction 308 is covered to shield it from the depositions. U-shaped pillars 810 of a semiconductor material are formed in the holes 782 and 788 in the left-hand construction 304 for the memory cells. Each U-shaped pillar 810 extends from the first set of fingers 672 to the second set of fingers 678 and functions as a body (a source, a channel and/or a drain) of several memory cell transistors in the fingers 672 and 678; for example, where there is one memory cell transistor for each access line. Each U-shaped pillar 810 comprises, for example, silicon or polysilicon (e.g., a tube of silicon or polysilicon with a core, where the core may be filled with air or a dielectric material). The charge storage structures (e.g., charge traps or floating gates) are formed in the holes 782 and 788 around the U-shaped pillars 810.

Gates (e.g., comprising polysilicon) (not shown) for decoder transistors are formed in the holes 794 in the second portions 340, 344, 348, 352 and 356 of the tiers 210, 214, 218, 222, and 226 of the first decoder block 654. Likewise, gates for decoder transistors are formed in the holes 794 in the second portions 340, 344, 348, 352 and 356 of the tiers 210, 214, 218, 222, and 226 of the second decoder block 658. The gates may be formed by depositing a dielectric material such as silicon dioxide followed by a polysilicon layer to form a gate oxide and the gates, respectively, while the left-hand construction 304 is covered to shield it from the depositions. The gates may be deposited and etched as separate gates, or may be deposited and etched as a single gate for both the first decoder block 654 and the second decoder block 658.

Polysilicon may be deposited for the U-shaped pillars 810 in the let hand construction 304 and the gates for the decoder transistors in the first decoder block 654 and/or the second decoder block 658 at the same time or in separate steps.

Lines 882 are formed to couple to the gates (not shown) for decoder transistors in the first decoder block 654 and the second decoder block 658. The polysilicon of the U-shaped pillars 810 in the left-hand construction 304 may also be the gates for the decoder transistors in the first decoder block 654 or the second decoder block 658. The lines 882 may be, for example, tungsten, aluminum or copper. The lines 882 may be replaced by semiconductor lines such as polysilicon lines.

Data lines 826 and source lines (not shown such as those comprising metal or doped polysilicon, are formed in respective contact with the opposing ends of the U-shaped pillars 810 in the holes 782 and 788 in the left-hand construction 304. The data lines 826 may be arranged to be substantially parallel to each other and substantially perpendicular to the select gates 680, 682, 684, 686, 688, 690, 692, 694, 696 and 698. The data lines 826 comprise metal or polysilicon. The first portions 310, 314, 318 and 322 of the tiers 210, 214, 218 and 222, respectively, each function as an access line to a respective memory cell transistor(s) formed in and around each of the U-shaped pillars 810. The metal may be, for example, titanium nitride (TiN), tantalum (Ta), tantalum nitride (TaN) or Tungsten (W).

For purposes of brevity and clarity, the coupling of the decoder transistors of the first decoder block 654 to access lines and select lines is not shown in FIG. 8. The decoder transistors of the second decoder block 658, however, are shown coupled to access lines of the first portions 310 and 314 of the tiers 210 and 214, respectively, and the select gates 684 and 686 by lines 840, 850, 860 and 870. The lines 840, 850, 860 and 870 may be formed at the same time and/or from the same material used to form data lines 826 or source lines (not shown), such as, for example, polysilicon, tungsten, aluminum or copper. In another embodiment, data lines 826 or source lines (not shown) and lines 840, 850, 860 and 870 may be formed at different times and/or from different materials. As depicted, line 840 is formed to couple the first portion 310 to the second portion 340. The line 850 is formed to couple the first portion 314 to the second portion 344. The line 860 is formed to couple the select gate 684 to the second portion 348. The line 870 is formed to couple the select gate 686 to the second portion 352. For brevity and clarity, the coupling of other access lines and select gates of the left-hand construction 304 to decoder transistors is not shown. The semiconductor construction 200 shown in FIGS. 2-8 is arranged such that the access lines of the first portions 310, 314, 318 and 322 of the tiers 210, 214, 218 and 222, respectively, are stacked with respect to each other.

Figure 9:
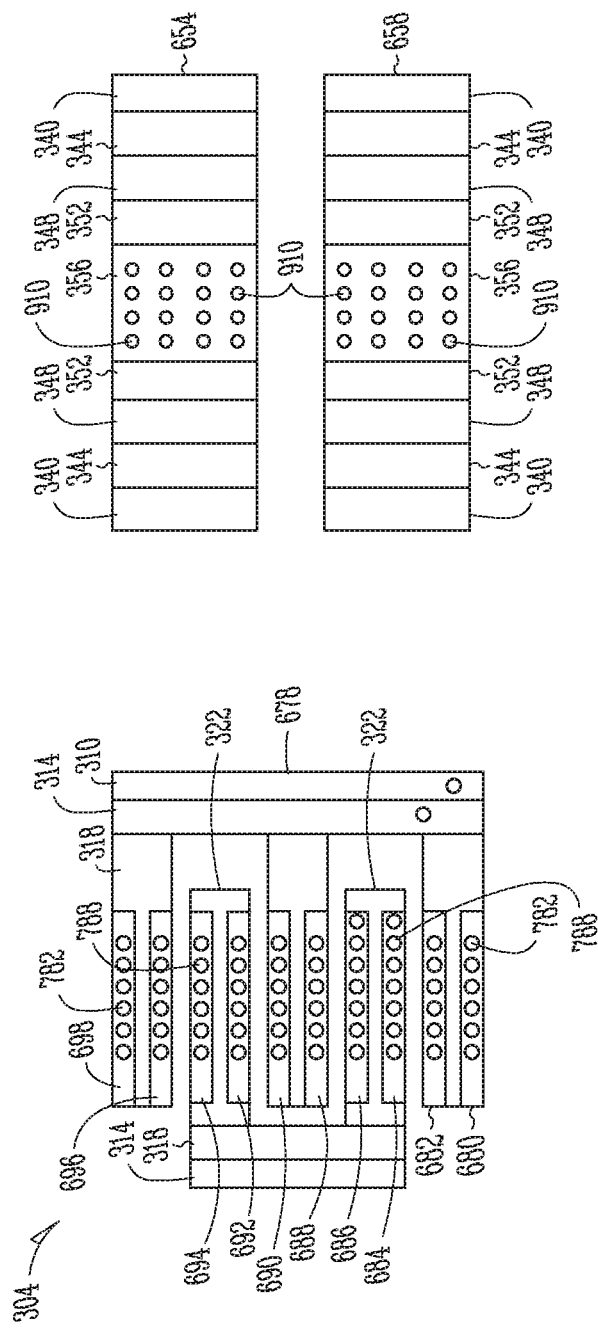
FIG. 9 is a top view of a semiconductor construction according to various embodiments of the invention.

FIG. 9 is a top view of the semiconductor construction 200 according to various embodiments of the invention. The left-hand construction 304 is the same as the left-hand construction 304 shown in FIG. 7, and the right-hand construction 308 is the same as the right-hand construction 308 shown in FIG. 6 before holes are etched as described above. The same reference numerals identify the same elements for purposes of brevity and clarity.

Each of the second portions 340, 344, 348, 352 and 356 of the tiers 210, 214, 218, 222, and 226, respectively, in the first decoder block 654 and the second decoder block 658 of the right-hand construction 308 functions as a body (a source, a channel and/or a drain) of a decoder transistor that is to be coupled to an access line of a memory cell. Holes 910 are etched through all of the second portions 340, 344, 348, 352 and 356 of the tiers 210, 214, 218, 222, and 226, respectively, in the first decoder block 654 and the second decoder block 658 to accommodate polysilicon gates of the decoder transistors. The holes 910 in the right-hand construction 308 are the same size as the holes 782 or 788 in the left-hand construction 304 and are etched at the same time. Multiple rows and columns of the holes 910 are etched to enable a higher driving current through the right-hand construction 308.

Gates may be formed by depositing a dielectric material such as silicon dioxide followed by a polysilicon layer in the right-hand construction 308 to form a gate oxide and the gates while the left-hand construction 304 is covered to shield it from these depositions. The gates may be deposited and etched as separate gates, or may be deposited and etched as a single gate for both the first decoder block 654 and the second decoder block 658. Memory cell transistors may be formed by depositing art inter-poly dielectric, a storage element such as a floating gate and SiN, a tunnel oxide and a polysilicon layer in the left-hand construction. 304 while the right-hand construction 308 is covered to shield it from these depositions.

Figure 10:
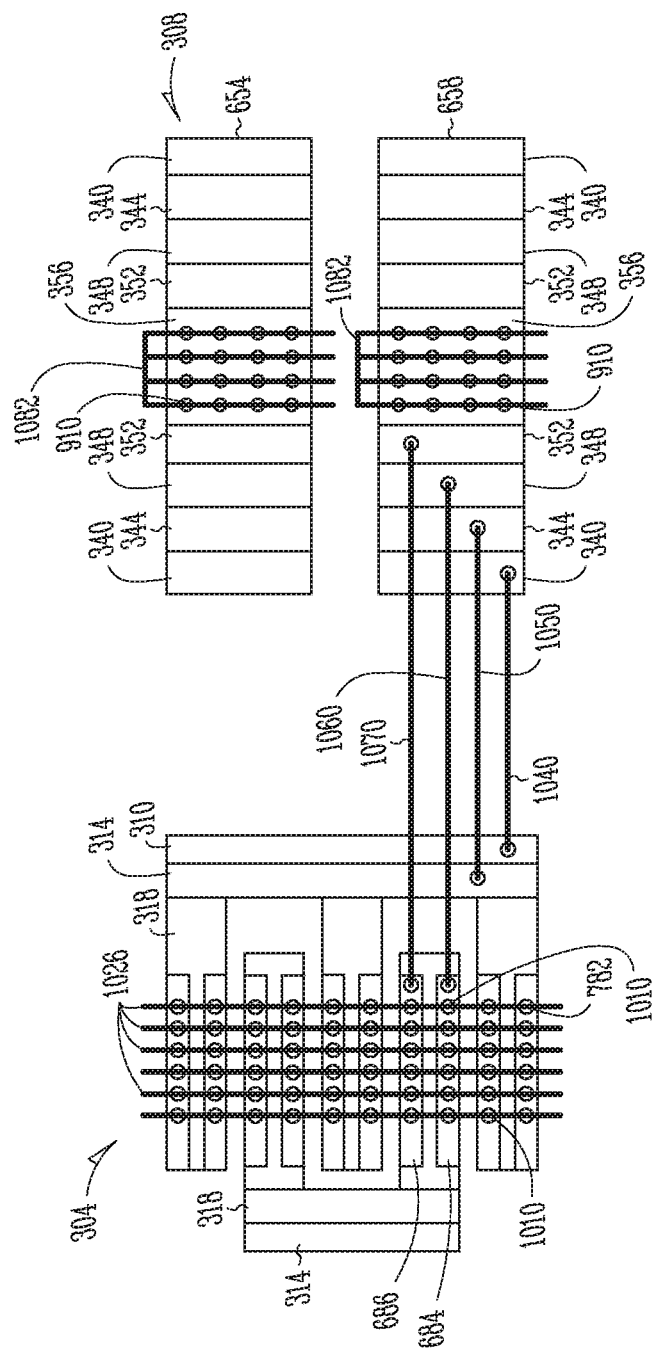
FIG. 10 is a top view of a semiconductor construction according to various embodiments of the invention.

FIG. 10 is a top view of the semiconductor construction 200 according to various embodiments of the invention. U-shaped pillars 1010 of a semiconductor material are formed in the holes 782 and 788 in the left-hand construction 304 for the memory cells as shown in FIG. 7. Data lines 1026 and source lines (not shown), such as those comprising metal or doped polysilicon, are formed in respective contact with the opposing ends of the U-shaped pillars 1010 in the holes 782 and 788 in the left-hand construction 304 as shown in FIG. 10. The data lines 1026 may be arranged to be substantially parallel to each other and substantially perpendicular to the select gates 680, 682, 684, 686, 688, 690, 692, 694, 696 and 698. The first portions 310, 314, 318 and 322 of the tiers 210, 214, 218 and 222, respectively, each function as an access line to a respective memory cell transistor(s) formed in and around each of the U-shaped pillars 1010.

Lines 1082 are formed through the holes 910 of the first decoder block 654 and the second decoder block 658 to couple to the gates of the decoder transistors. The polysilicon of the U-shaped pillars 1010 in the left-hand construction 304 may also be the gates for the decoder transistors in the first decoder block 654 or the second decoder block 658. The lines 1082 may be, for example, tungsten, aluminum or copper. The lines 1082 may be replaced by semiconductor lines such as polysilicon lines.

The decoder transistors of the first decoder block 654 are to be coupled to memory cell transistors not shown in FIG. 10. The decoder transistors of the second decoder block 658 are coupled to access lines of the first portion 310 and the first portion 314 and the select gates 684 and 686 by lines 1040, 1050, 1060 and 1070. The lines 1040, 1050, 1060 and 1070 may be, for example, tungsten, aluminum or copper. The lines 1040, 1050, 1060 and 1070 may be replaced by a semiconductor such as polysilicon. The line 1040 is routed to couple the first portion 310 to the second portion 340. The line 1050 is routed to couple the first portion 314 to the second portion 344. The line 1060 is routed to couple the select gate 684 to the second portion 348. The line 1070 is routed to couple the select gate 686 to the second portion 352. The other access lines and select gates of the left-hand construction 304 are coupled to decoder transistors not shown. The semiconductor construction 200 shown in FIGS. 2-10 is arranged such that the access lines of the first portions 310, 314, 318 and 322 of the tiers 210, 214, 218 and 222, respectively, are stacked with respect to each other.

The polysilicon used to form the access lines in the first portions 310, 314, 318 and 322 of the tiers 210, 214, 218, 222, and 226, respectively, may have the same or a different implant concentration than the polysilicon of the bodies of decoder transistors in the second portions 340, 344, 348, 352 and 356 of the tiers 210, 214, 218, 222, and 226, respectively. Also, although the previous description focused on embodiments where both access lines and bodies of the decoder transistors are formed from polysilicon, in other embodiments, the access lines may be replaced by metal. In such cases, at least a portion of one of constructions 304 or 308 may be masked while the other construction or portion of the construction 304 or 308 is processed.

The semiconductor construction 200 comprises access lines of memory cells and bodies of peripheral transistors, such as decoder transistors in the same tiers of semiconductor material. Gates of the decoder transistors may also be formed from the same semiconductor material deposited to form bodies of the memory cells.

The embodiments of the semiconductor construction 200 shown in FIGS. 2 to 10 are examples of the semiconductor memory device 100 shown in FIG. 1 according to various embodiments of the invention.

Figure 11:
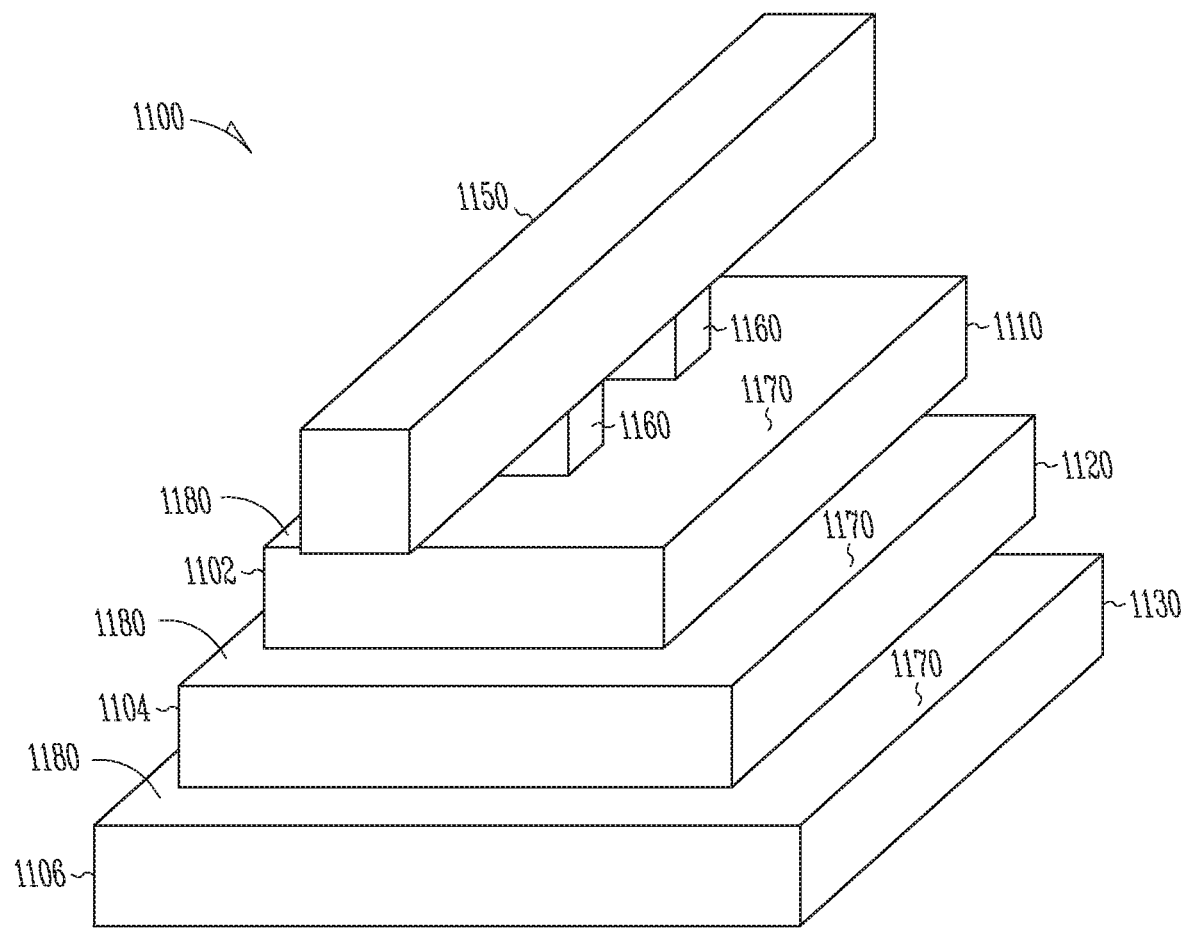
FIG. 11 is a three-dimensional view of decoder transistors according to various embodiments of the invention.

FIG. 11 is a three-dimensional view of decoder transistors 1100 according to various embodiments of the invention that are examples of the decoder transistors in the decoder blocks 654 and 658 shown in FIGS. 6-10. Three decoder transistors 1102, 1104 and 1106 are formed in three tiers 1110, 1120 and 1130 of polysilicon. The tiers 1110, 1120 and 1130 are arranged one above the other in a staircase configuration. The tier 1130 is larger than the tier 1120 above it, and the tier 1120 is larger than the tier 1110 above it. The tiers 1110, 1120 and 1130 are separated from each other by a dielectric such as silicon dioxide (not shown). Polysilicon, for example, can be used to form a block select line 1150 above the tiers 1110, 1120 and 1130, and two gates 1160 are formed in holes (e.g., holes 794) in the tiers 1110, 1120 and 1130. Portions of the tiers 1110, 1120 and 1130 on one side of the line 1150 function as drains 1170 for the decoder transistors 1102, 1104 and 1106. Portions of the tiers 1110, 1120 and 1130 on a second side of the line 1150 function as sources 1180 for the decoder transistors 1102, 1104 and 1106. Polysilicon in the tiers 1110, 1120 and 1130 between the sources 1180 and the drains 1170 function as channels for the decoder transistors 1102, 1104 and 1106.

Figure 12:
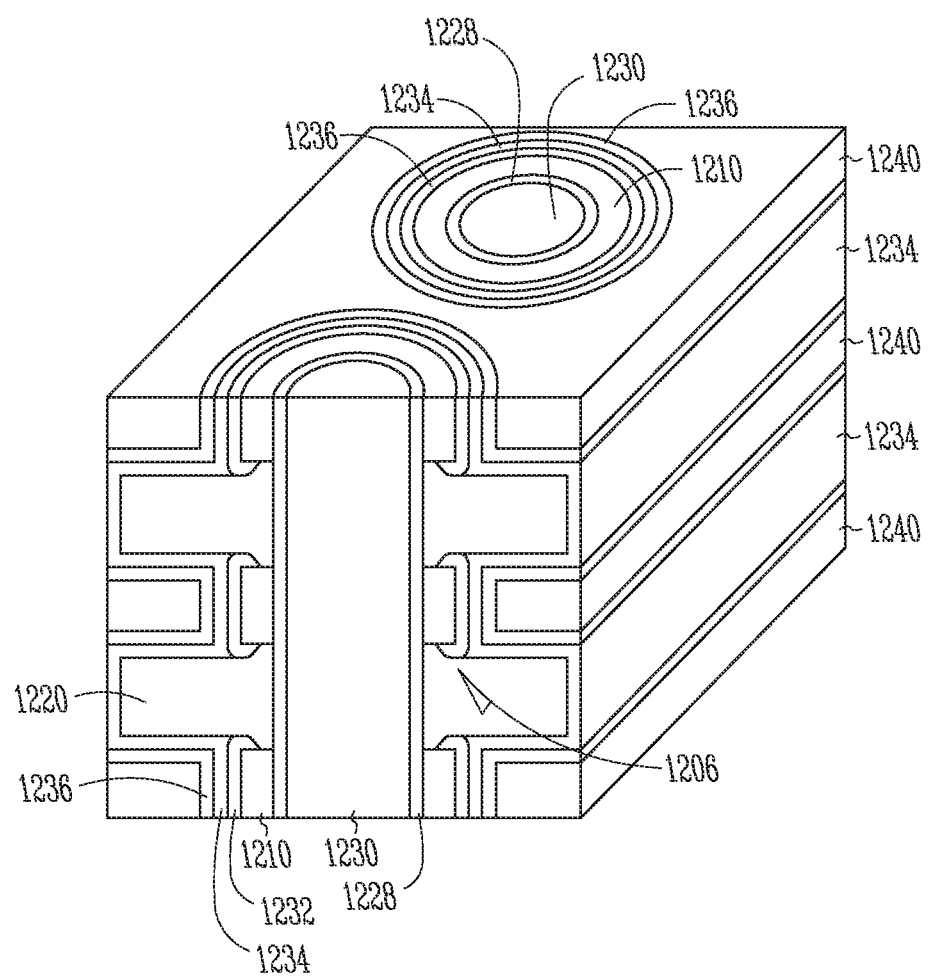
FIG. 12 is a three-dimensional view of memory cells according to various embodiments of the invention.

FIG. 12 is a three-dimensional view of memory cells according to various embodiments of the invention that are examples of memory cells and portions of the U-shaped pillars 810 in the left-hand construction 304 shown in FIGS. 8 and 10. FIG. 12 shows six three-dimensional memory cells 1206. Each memory cell 1206 is a charge storage transistor including a ring of type polysilicon 1210 that functions as a floating gate. The rings of type polysilicon 1210 are separated from each other by tiers of dielectrics 1220. Polysilicon pillars 1230 pass through the rings of p+ type polysilicon 1210, and are separated from their respective rings by tunnel dielectric 1228. Between the tiers of dielectric material 1220, each of the rings of p+ type polysilicon 1210 are surrounded by an inter-poly dielectric (IPD) 1236, such as one comprising silicon dioxide, silicon nitride ($Si_3N_4$) and silicon dioxide (ONO), and a respective polysilicon access line 1240. The tiers of dielectrics 1220 and the tunnel dielectric 1228 may be, for example, silicon dioxide. The memory cells 1206 are arranged such that the access lines 1240 are stacked. The access lines 1240 may comprise metal and not polysilicon.

Figure 13:
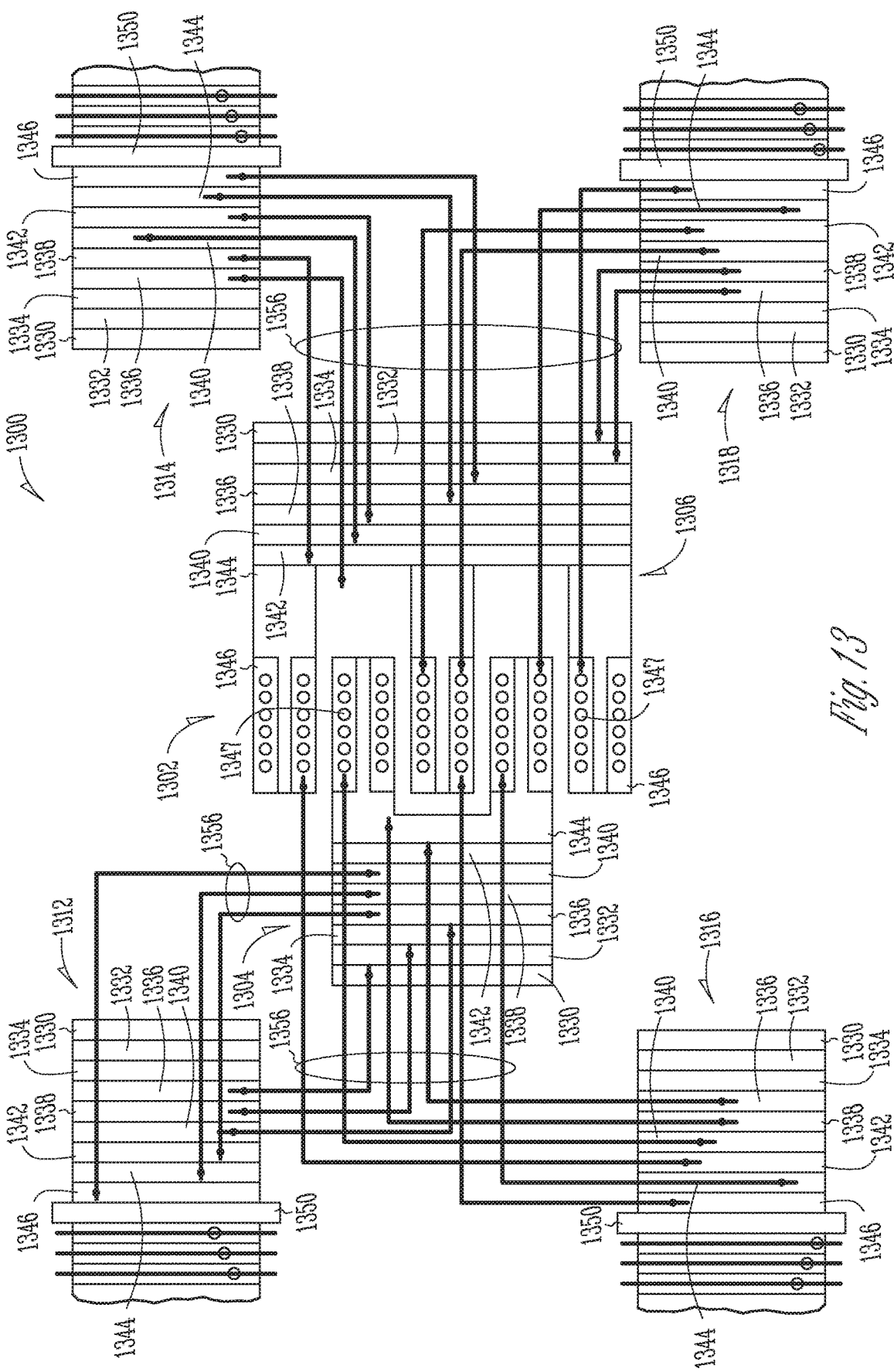
FIG. 13 is a schematic view of a semiconductor construction according to various embodiments of the invention.

FIG. 13 is a schematic view of a semiconductor construction 1300 according to various embodiments of the invention. The semiconductor construction 1300 includes an array 1302 of memory cells and four decoder blocks of decoder transistors, a first decoder block 1312, a second decoder block 1314, a third decoder block 1316 and a fourth decoder block 1318. The array 1302 is divided into a first array 1304 and a second array 1306 of memory cells each having fingers that are interdigitally arranged. Each of the array 1302 and decoder blocks 1312, 1314, 1316 and 1318 are formed in nine tiers 1330, 1332, 1334, 1336, 1338, 1340, 1342, 1344 and 1346 of n-type polysilicon. The tiers 1330, 1332, 1334, 1336, 1338, 1340, 1342, 1344 and 1346 of polysilicon are separated from each other by tiers of dielectric such as silicon dioxide (not shown), and the array 1302 and the decoder blocks 1312, 1314, 1316 and 1318 are etched into staircase configurations. The tiers 1330, 1332, 1334, 1336, 1338, 1340, 1342, 1344 and 1346 of polysilicon in each of the first array 1304 and the second array 1306 function as access lines for memory cells or select gates. U-shaped pillars 1347 extend between the first array 1304 and the second array 1306. Each U-shaped pillar 1347 functions as a body (a source, a channel and/or a drain) of a memory cell transistor for each access line that at least partially surrounds that U-shaped pillar 1347. Each U-shaped pillar 1347 comprises a semiconductor material, such as silicon or polysilicon (e.g., a tube of silicon or polysilicon with a core, where the core may be filled with air or a dielectric material). The top tier 1346 in the first array 1304 and the second array 1306 is etched into select gates, and each select gate is coupled to ends of multiple ones of the U-shaped pillars 1347.

Some of the tiers 1330, 1332, 1334, 1336, 1338, 1340, 1342, 1344 and 1346 of polysilicon in each of the decoder blocks 1312, 1314, 1316 and 1318 function as a body (a source, a channel and/or a drain) of a decoder transistor that is to be coupled to an access line of a memory cell or a select gate, and some may not be coupled to an access line or a select gate. Polysilicon gates 1350 for the decoder transistors extend through holes in the tiers 1330, 1332, 1334, 1336, 1338, 1340, 1342, 1344 and 1346 of polysilicon in each of the decoder blocks 1312, 1314, 1316 and 1318. 24 lines 1356 (WL0 to WL15 and SG0-7) are shown coupling the separate portions of individual tiers 1330, 1332, 1334, 1336, 1338, 1340, 1342, 1344 and 1346 of polysilicon in each of the first array 1304 and the second array 1306 to one of the tiers 1330, 1332, 1334, 1336, 1338, 1340, 1342, 1344 and 1346 of polysilicon in a respective one of the decoder blocks 1312, 1314, 1316 and 1318. Eight of the lines 1356 are shown to couple each of eight select gates formed in the top tier 1346 to a respective one of the tiers 1330, 1332, 1334, 1336, 1338, 1340, 1342, 1344 and 1346 of polysilicon in a respective one of the decoder blocks 1312, 1314, 1316 and 1318. The respective coupling of the lines 1356 is provided in Table I, in which WL # indicates an access line and SG # indicates a select gate. A line 1356 may couple the same tiers to each other, such as shown with respect to WL2 (which is coupled from tier 1340 in the second array 1306 to the same tier 1340 in the decoder block 1314). Alternatively, a line 1356 may couple different tiers to each other, such as shown with respect to WL 11 (which is coupled from tier 1336 in the first array 1304 to tier 1342 in the decoder block 1312. "X" indicates that the bottom three tiers 1330, 1332, 1334 of polysilicon in each of the decoder blocks 1312, 1314, 1316 and 1318 are not coupled to access lines and are unused. As a result, all nine tiers 1330, 1332, 1334, 1336, 1338, 1340, 1342, 1344 and 1346 of polysilicon are used as access lines while six tiers 1336, 1338, 1340, 1342, 1344 and 1346 of polysilicon are used as decoder transistors. A ratio of nine tiers of polysilicon used as access lines to six tiers of polysilicon used as decoder transistors is shown in FIG. 13. Other ratios such as eight to five or ten to seven or one to one may also be used. For example, one of the decoder blocks 1312, 1314, 1316 and 1318 could be used for other memory cells (not shown with all tiers of polysilicon in the remaining decoder blocks being used as decoder transistors. The decoder blocks 1312, 1314, 1316 and 1318 may be aligned with the array 1302 to accommodate the routing of data lines.

TABLE 1

|  | 1312 | 1316 | 1304 | 1306 | 1314 | 1318 |
| --- | --- | --- | --- | --- | --- | --- |
| 1346 | WL13 | SG3 | SG0-3 | SG4-7 | WL5 | SG7 |
| 1344 | WL12 | SG2 | WL15 | WL0 | WL4 | SG6 |
| 1342 | WL11 | SG1 | WL14 | WL1 | WL3 | SG5 |
| 1340 | WL10 | SG0 | WL13 | WL2 | WL2 | SG4 |
| 1338 | WL9 | WL15 | WL12 | WL3 | WL1 | WL7 |
| 1336 | WL8 | WL14 | WL11 | WL4 | WL0 | WL6 |
| 1334 | X | X | WL10 | WL5 | X | X |
| 1332 | X | X | WL9 | WL6 | X | X |
| 1330 | X | X | WL8 | WL7 | X | X |

The embodiment of the semiconductor construction 1300 shown in FIG. 13 is an example of the semiconductor memory device 100 shown in FIG. 1 according to various embodiments of the invention.

Figure 14:
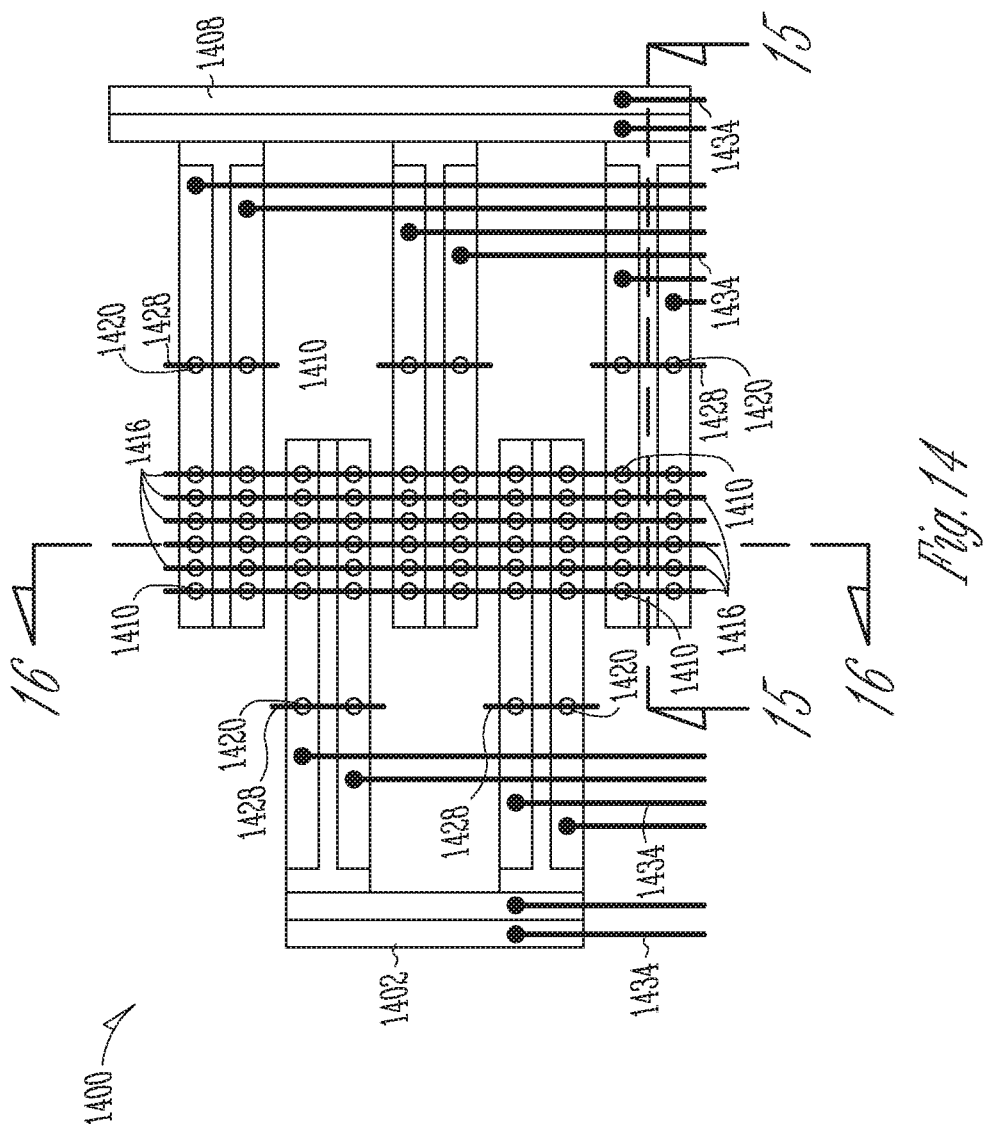
FIG. 14 is a top view of a semiconductor construction according to various embodiments of the invention.

FIG. 14 is a top view of a semiconductor construction 1400 according to various embodiments of the invention. The semiconductor construction 1400 is formed from tiers of polysilicon formed alternately with a dielectric. The semiconductor construction 1400 is etched into a first set of fingers 1402 and a second set of fingers 1408 that are interdigitally arranged. One or more of the tiers in the semiconductor construction 1400 are unbroken, integrally formed tiers of polysilicon that include a body (a source, a channel and/or a drain) of a peripheral transistor and an access line of a memory cell or a select gate. One or more of the unbroken, integrally formed tiers of polysilicon may include a body (a source, a channel and/or a drain) of a peripheral transistor and a body (a source, a channel and/or a drain) of a memory cell or a select gate according to various embodiments of the invention. The peripheral transistor can be a decoder transistor. First holes are etched through the tiers of polysilicon of the first set of fingers 1402 and the second set of fingers 1408, and first pillars 1410 of a semiconductor material are formed in the first holes to be channels for memory cells. The first pillars 1410 comprise silicon or polysilicon. Lines 1416 are formed in contact with ends of the first pillars 1410 to be data lines for the first pillars 1410. Second holes are etched through the tiers of polysilicon of the first set of fingers 1402 and the second set of fingers 1408, and second pillars 1420 of a semiconductor material are formed in the second holes to be select lines for peripheral transistors such as decoder transistors in the tiers of polysilicon. The second pillars 1420 comprise silicon or polysilicon and can be connected to polysilicon gates of peripheral transistors. Lines 1428 are formed in contact with ends of the second pillars 1420. Global access or select lines 1434 are formed in contact with the tiers of polysilicon in the first set of fingers 1402 and the second set of fingers 1408. The first holes and the second holes are approximately the same size according to various embodiments of the invention. The lines 1416, 1428 and 1434 may be, for example, tungsten, aluminum or copper. The lines 1416, 1428 and 1434 may be replaced by semiconductor lines such as polysilicon lines.

Figure 15:
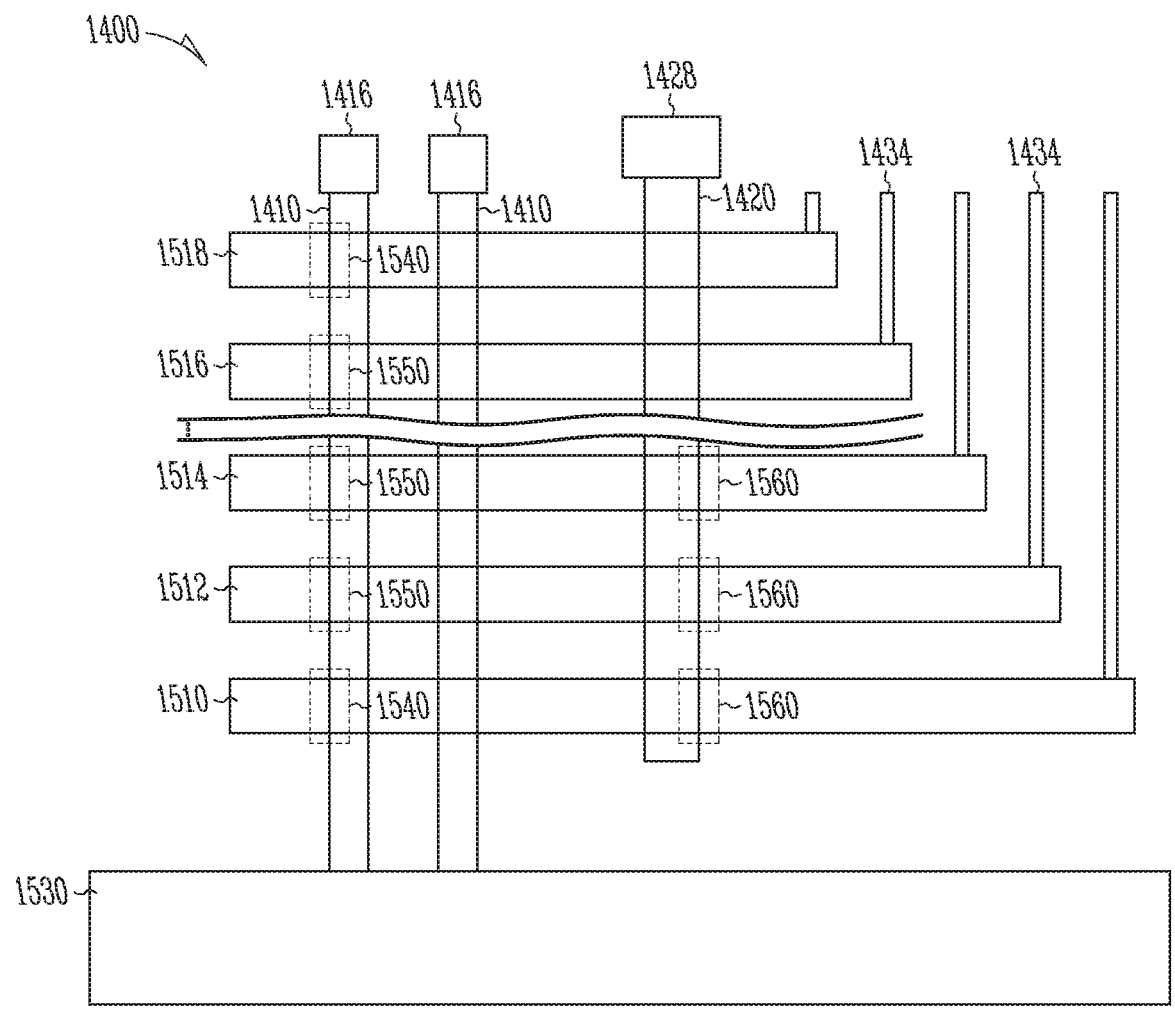
FIG. 15 is a cross-sectional view of a semiconductor construction according to various embodiments of the invention.

FIG. 15 is a cross-sectional view of the semiconductor construction 1400 according to various embodiments of the invention. The semiconductor construction 1400 includes unbroken, integrally formed tiers of polysilicon 1510, 1512, 1514, 1516 and 1518 over a silicon substrate 1530. The first pillars 1410 extend from the lines 1416 through the tiers 1510, 1512, 1514, 1516 and 1518 to the substrate 1530. The tiers 1510 and 1518 include select transistors 1540 (indicated by hidden lines) to select one or more of the first pillars 1410 passing through them. The tiers 1512, 1514 and 1516 are access lines for charge storage devices 1550 (indicated by hidden lines) for which the first pillars 1410 are channels. The first pillars 1410 may be U-shaped pillars that pass through the substrate 1530 or may end in the substrate 1530. The second pillars 1420 extend from the lines 1428 through the tiers 1510, 1512, 1514, 1516 and 1518 and end before the substrate 1530. The second pillars 1420 are in contact with peripheral transistors 1560 in the tiers 1510, 1512 and 1514. The tiers 1516 and 1518 may also include peripheral transistors. The lines 1434 extend from the tiers of 1510, 1512, 1514, 1516 and 1518. The semiconductor construction 1400 includes more tiers of polysilicon than are shown in FIG. 15.

Figure 16:
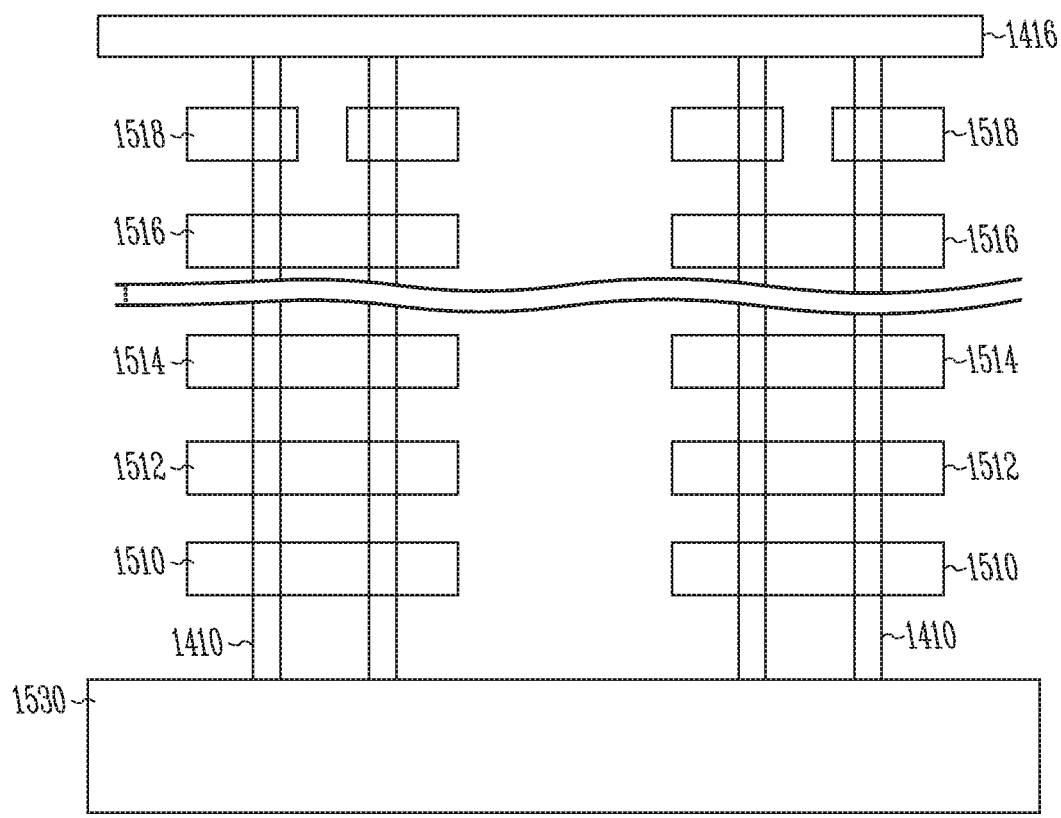
FIG. 16 is a cross-sectional view of a semiconductor construction according to various embodiments of the invention.

FIG. 16 is a cross-sectional view of the semiconductor construction 1400 according to various embodiments of the invention. The first pillars 1410 shown in FIG. 16 extend from one of the lines 1416 through the tiers 1510, 1512, 1514, 1516 and 1518 to the substrate 1530. The tiers 1512, 1514, 1516 and 1518 are divided into separate portions such that two of the first pillars 1410 pass through each of the portions of the tiers 1510, 1512, 1514 and 1516 and each pillar 1410 passes through one of the portions of the tier 1518. Each of the portions of the tiers 1510 and 1518 includes a select gate to select the first pillar or pillars 1410 passing through it. The portions of the tiers 1512, 1514 and 1516 are access lines for charge storage devices for which the first pillars 1410 are channels.

The embodiments of the semiconductor construction 1400 shown in FIGS. 14 to 16 are examples of the semiconductor memory device 100 shown in FIG. 1 according to various embodiments of the invention.

Figure 17:
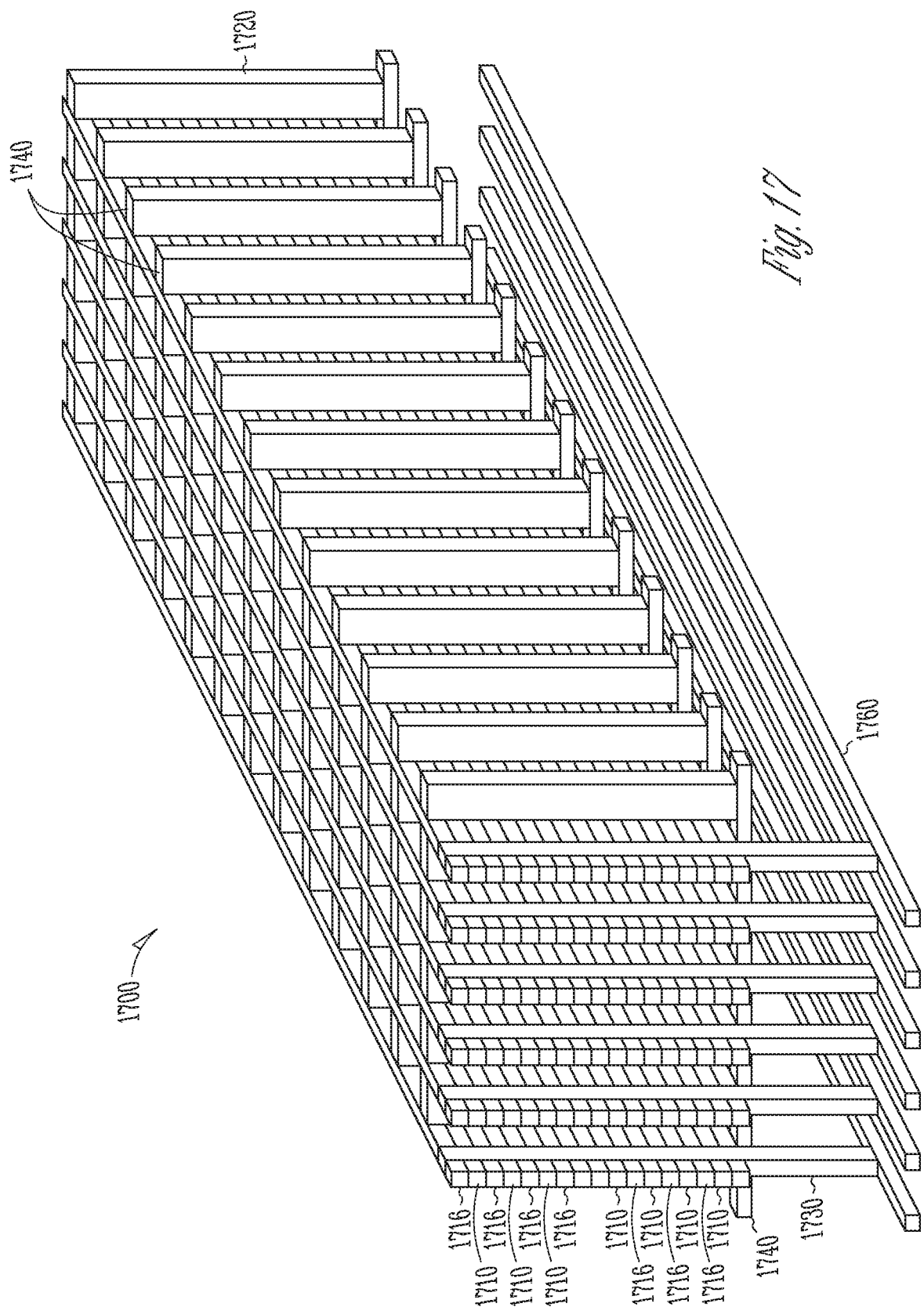
FIG. 17 is a perspective view of a semiconductor memory device according to various embodiments of the invention.

FIG. 17 is a perspective view of a semiconductor memory device 1700 according to various embodiments of the invention. The memory device 1700 includes horizontal nand-strings of charge storage devices. Bodies (each may include a source, a channel and/or a drain) of the charge storage devices of a nandstring are shared in a horizontal bar 1710 of a semiconductor material such as polysilicon. The memory device 1700 includes multiple horizontal bars 1710 separated from each other by horizontal dielectrics 1716. Each horizontal bar 1710 may have a rectangular or a circular cross-section. Each horizontal bar 1710 includes the bodies of twelve charge storage devices, although the horizontal bars 1710 may support a different number of charge storage devices. Eight horizontal bars 1710 are arranged in a vertical plane, and each horizontal bar 1710 in a vertical plane is connected at a first end to a first vertical pillar 1720 of semiconductor material such as polysilicon that is a common source line (CSL) which is a voltage source. Each horizontal bar 1710 in the plane is connected at a second end to a second vertical pillar 1730 of semiconductor material such as polysilicon that is a data line for the charge storage devices in the plane. The bodies of the charge storage devices in each horizontal bar 1710 are aligned with the bodies above and below them in the vertical plane, and third vertical pillars 1740 of semiconductor material such as polysilicon function as access lines for charge storage devices in the vertical plane. Each third vertical pillar 1740 is an access line for one charge storage device associated with each horizontal bar 1710 and extends through all of the horizontal bars 1710 in the vertical plane. Six vertical planes of horizontal bars 1710 are shown in FIG. 17 as a single memory device, although the memory device 1700 may include a different number of horizontal bars 1710 and associated charge storage devices. The second vertical pillars 1730 change direction and have horizontal portions 1760 that pass underneath the semiconductor construction 1700. The horizontal portions 1760 of the second vertical pillars 1730 extend the data lines in a horizontal direction substantially parallel with the horizontal bars 1710.

Figure 18:
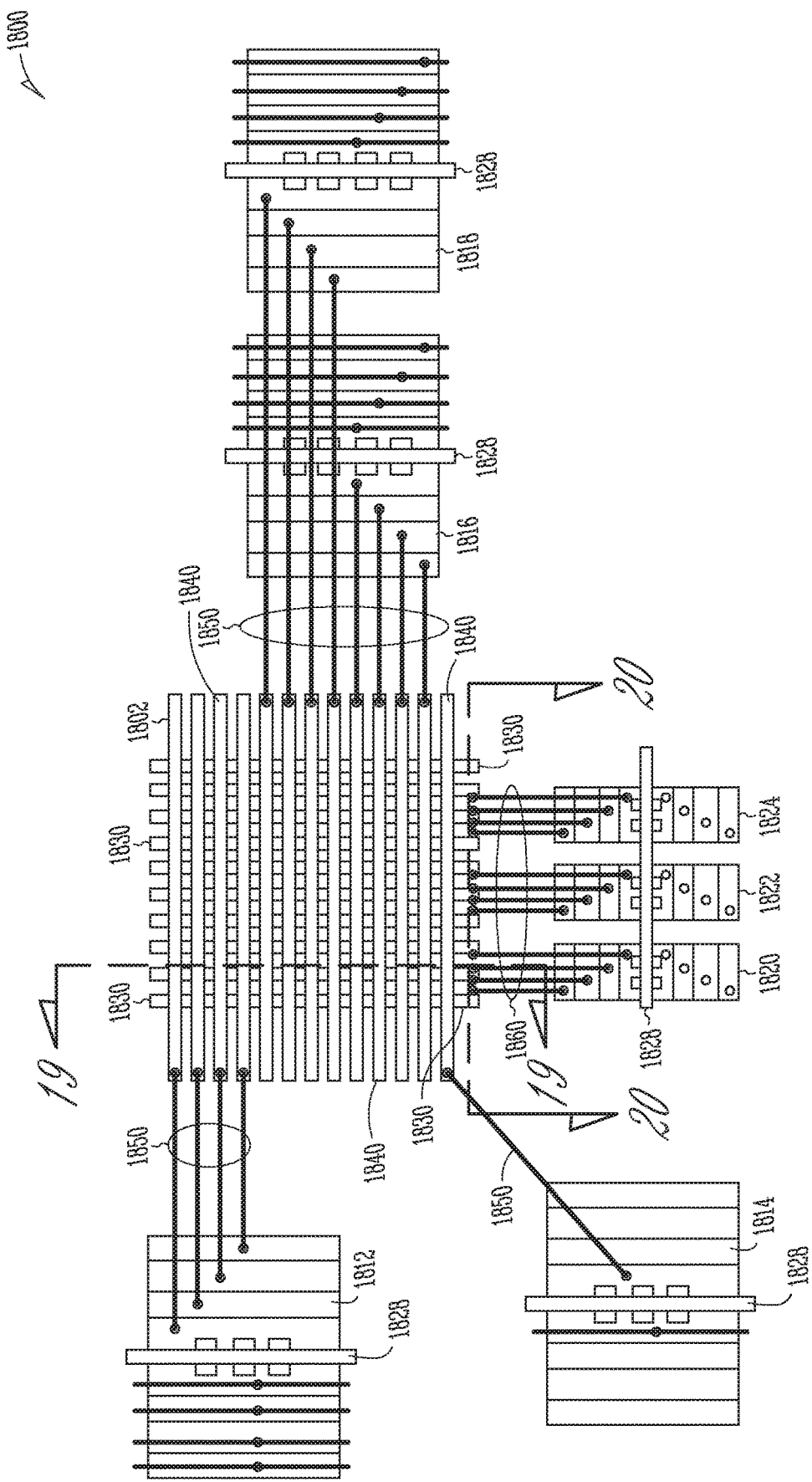
FIG. 18 is a schematic view of a semiconductor construction according to various embodiments of the invention.

FIG. 18 is a schematic view of a semiconductor construction 1800 according to various embodiments of the invention. The semiconductor construction 1800 comprises an array 1802 of memory cells and seven decoder blocks 1812, 1814, 1816, 1818, 1820, 1822 and 1824 of decoder transistors. The decoder blocks 1812, 1814, 1816, 1818, 1820, 1822 and 1824 each comprise multiple decoder transistors with polysilicon gates 1828, and have a staircase configuration. The array 1802 comprises bodies of memory cells, each comprising a source, a channel and/or a drain, formed in respective; horizontal bars 1830 of semiconductor material, such as n-type polysilicon. Access lines 1840 are formed in contact with the cells in the horizontal bars 1830. The access lines 1840 are vertical pillars of a semiconductor material, such as n-type polysilicon. Each access line 1840 is coupled to a respective decoder transistor in a respective one of the decoder blocks 1812, 1814, 1816 and 1818 through a respective one of conductive lines 1850. Each horizontal bar 1830 is coupled to a respective decoder transistor in a respective one of the decoder blocks 1820, 1822 and 1824 through a respective one of data lines 1860. The decoder blocks 1816 and 1818 can be aligned with the array 1802 of memory cells. The decoder blocks 1812 and 1814 may also be aligned with the array 1802 of memory cells according to various embodiments of the invention.

Figure 19:
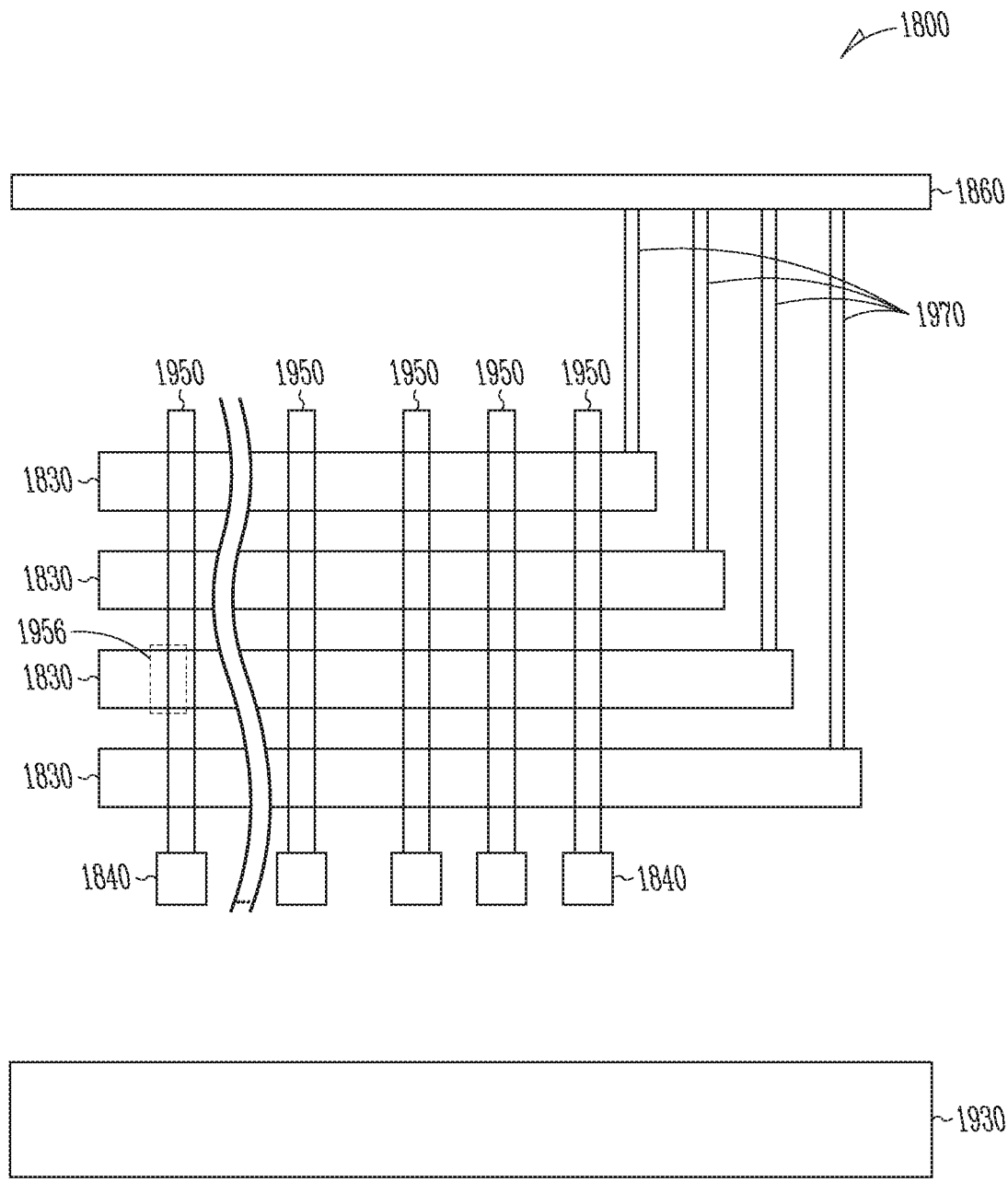
FIG. 19 is a cross-sectional view of a semiconductor construction according to various embodiments of the invention.

FIG. 19 is a cross-sectional view of the semiconductor construction 1800 according to various embodiments of the invention. The horizontal bars 1830 with the bodies of memory cells are located over a silicon substrate 1930. Cross-sectional views of the access lines 1840 are shown that are substantially orthogonal to the horizontal bars 1830. The access lines 1840 are substantially square, but may have a different geometry. Each access line 1840 has a first contact 1950 that extends to intersect with a plurality of the horizontal bars 1830. A charge storage device 1956 (indicated by hidden lines) is located at each intersection of a horizontal bar 1830 with a first contact 1950, and the first contacts 1950 may be separated from the horizontal bars 1830 by a dielectric such as silicon dioxide. Each horizontal bar 1830 is coupled to a data line 1860 through a second contact 1970. The first contacts 1950 and the second contacts 1970 comprise metal or polysilicon. The semiconductor construction 1800 includes more horizontal bars 1830 and more access lines 1840 than are shown in FIG. 19 according to various embodiments of the invention.

Figure 20:
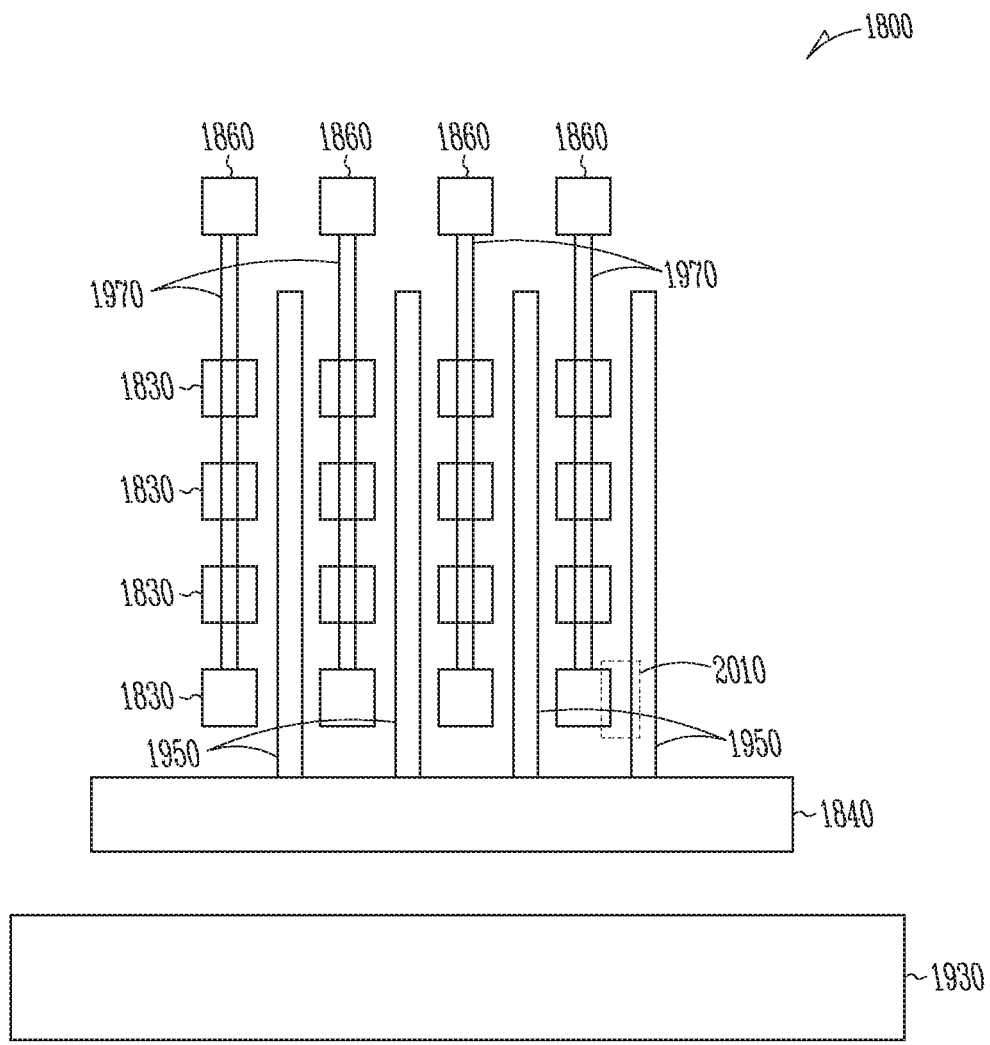
FIG. 20 is a cross-sectional view of a semiconductor construction according to various embodiments of the invention.

FIG. 20 is a cross-sectional view of the semiconductor construction 1800 according to various embodiments of the invention. Cross-sectional views of the horizontal bars 1830 and the data lines 1860 are illustrated in FIG. 20, and each data line 1860 is coupled to four of the horizontal bars 1830 by one of the second contacts 1970. The access lines 1840 and the data lines 1860 are substantially square, but may have different geometries. One of the access lines 1840 is shown between the silicon substrate 1930 and the horizontal bars 1830, and the first contacts 1950 extend from the access line 1840 toward the horizontal bars 1830. A charge storage device is located at each intersection between a horizontal bar 1830 and a first contact 1950, such as the charge storage device 2010 (indicated by hidden lines). The first contacts 1950 may be separated from the horizontal bars 1830 by a dielectric such as silicon dioxide. The semiconductor construction 1800 includes more horizontal bars 1830 and more access lines 1840 than are shown in FIG. 20 according to various embodiments of the invention.

The embodiments of the semiconductor construction 1800 shown in FIGS. 18 to 20 are examples of the semiconductor memory device 1700 shown in FIG. 17 according to various embodiments of the invention.

Figure 21:
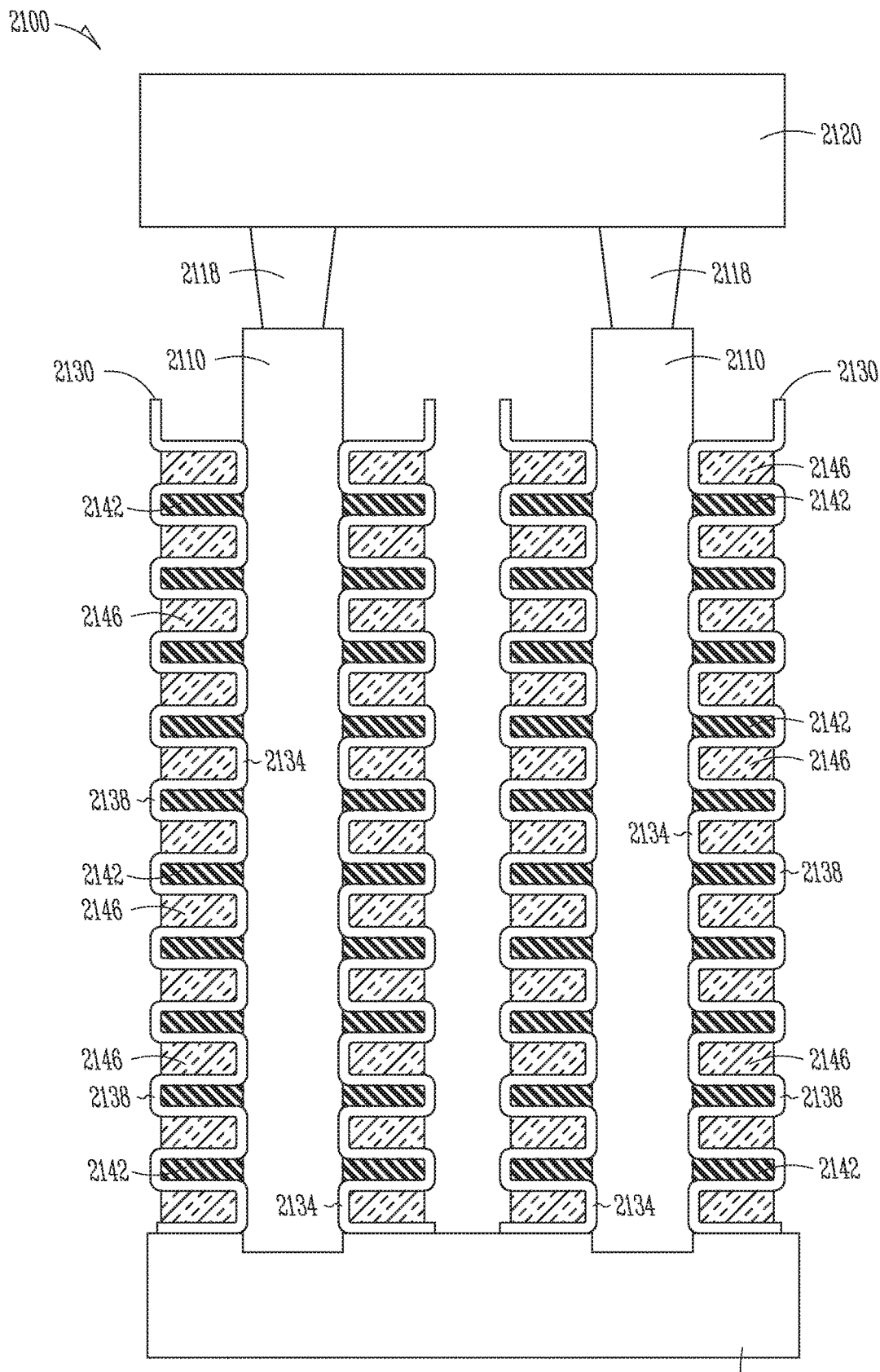
FIG. 21 is a cross-sectional view of a semiconductor memory device according to various embodiments of the invention.

FIG. 21 is a cross-sectional view of a semiconductor memory device 2100 according to various embodiments of the invention. The semiconductor construction 2100 includes charge trap layers arranged around two polysilicon pillars 2110 formed on a p-type silicon substrate 2114. Each pillar 2110 extends between the substrate 2114 and a conductive plug 2118. The conductive plugs 2118 comprise metal or polysilicon. The metal may be, for example, titanium nitride (TiN), tantalum (Ta), tantalum nitride (TaN) or Tungsten (W). The conductive plugs 2118 are in electrical contact with a data line 2120. The data line 2120 is at a drain end of the pillars 2110 and the substrate 2114 is at a source end of the pillars 2110. Current flows from the data line 2120 through the pillars 2110 to the substrate 2114 during powered operation of the semiconductor construction 2100.

Figure 22:
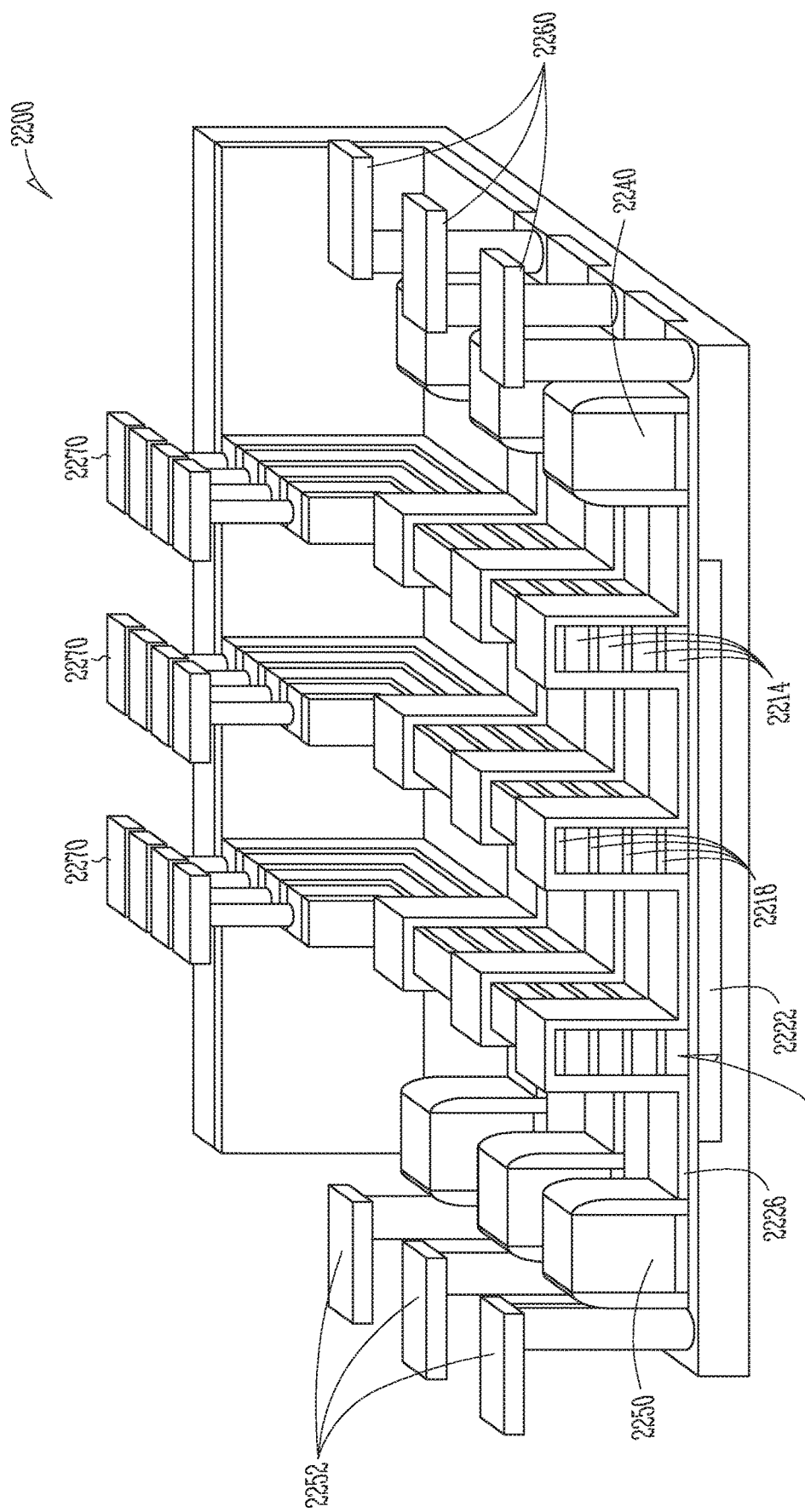
FIG. 22 is a cross-sectional view of a semiconductor memory device according to various embodiments of the invention.

Data is stored in a charge trap layer 2130 that surrounds each pillar 2110. Each charge trap layer 2130 has a serpentine pattern including first portions 2134 of the charge trap layer 2130 that are in contact with the pillar 2110 and second portions 2138 of the charge trap layer 2130 that are separated from the pillar by a dielectric 2142. The dielectric 2142 may comprise, for example, silicon dioxide ($SiO_2$), oxynitride or nitrided oxide. Each charge trap layer 2130 comprises a layer of silicon dioxide ($SiO_2$) that is a tunnel oxide layer closest to the pillar 2110. A trap layer of silicon nitride ($Si_3N_4$) is formed on the tunnel oxide layer, and a blocking layer is formed on the trap layer. The blocking layer may comprise silicon nitride ($Si_3N_4$) between two layers of silicon dioxide ($SiO_2$) that together comprise an inter-poly dielectric (IPD) layer of oxide-nitride-oxide ($SiO_2Si_3N_4SiO_2$ or "ONO"). Control gates 2146 surround each pillar 2110 in contact with respective ones of the first portions 2134 of the charge trap layer 2130 that are in contact with the pillar 2110. The control gates 2146 comprise metal or polysilicon. A potential of one or more of the control gates 2146 may be raised to store charge or read data in the respective first portions 2134 of the charge trap layer 2130. With reference to the decoder transistors 1100 shown in FIG. 11, the gates 1160 of the decoder transistors 1100 can be formed with the pillars 2110. In addition, the three tiers 1110, 1120 and 1130 of polysilicon including the sources 1180 and the drains 1170 of the decoder transistors 1100 can be formed with the control gates 2146 of the memory device 2100 according to various embodiments of the invention FIG. 22 is a cross-sectional view of a semiconductor memory device 2200 according to various embodiments of the invention. Charge storage devices of a nandstring are formed on a stack 2210 of four alternating layers of access lines 2214 and isolating films 2218. A gate dielectric and a channel 2226 of polysilicon are formed over the stack 2210 of access lines 2214 and isolating films 2218. The channel 2226 comprises eight charge storage devices controlled by the four access lines 2214 in the stack 2210. Each access line 2214 controls two charge storage devices in the channel 2226, one on each side of the stack 2210. Each channel 2226 is controlled by a source select line (SSL) transistor 2240 at a first end and a ground select line (GSL) transistor 2250 at a second end. Each GSL transistor 2250 is coupled to a line 2252 to receive a supply voltage and each SSL transistor 2240 is coupled to a data line 2260. Each access line 2214 is coupled to a metal terminal 2270. Each channel 2226 is formed over three stacks 2210 of access lines 2214, and each stack 2210 of access lines 2214 extends under three separate and substantially parallel channels 2226 such that the semiconductor construction 2200 comprises 72 charge storage devices. The channels 2226 may comprise a semiconductor material other than polysilicon. The semiconductor memory device 2200 may include a different number of channels 2226 and the stacks 2210 of access lines 2214 may be longer to extend under more channels 2226. With reference to the decoder transistors 1100 shown in FIG. 11, the gates 1160 of the decoder transistors 1100 can be formed with the access lines 2214. In addition, the three tiers 1110, 1120 and 1130 of polysilicon including the sources 1180 and the drains 1170 of the decoder transistors 1100 can be formed with the channels 2226 according to various embodiments of the invention.

Figure 23:
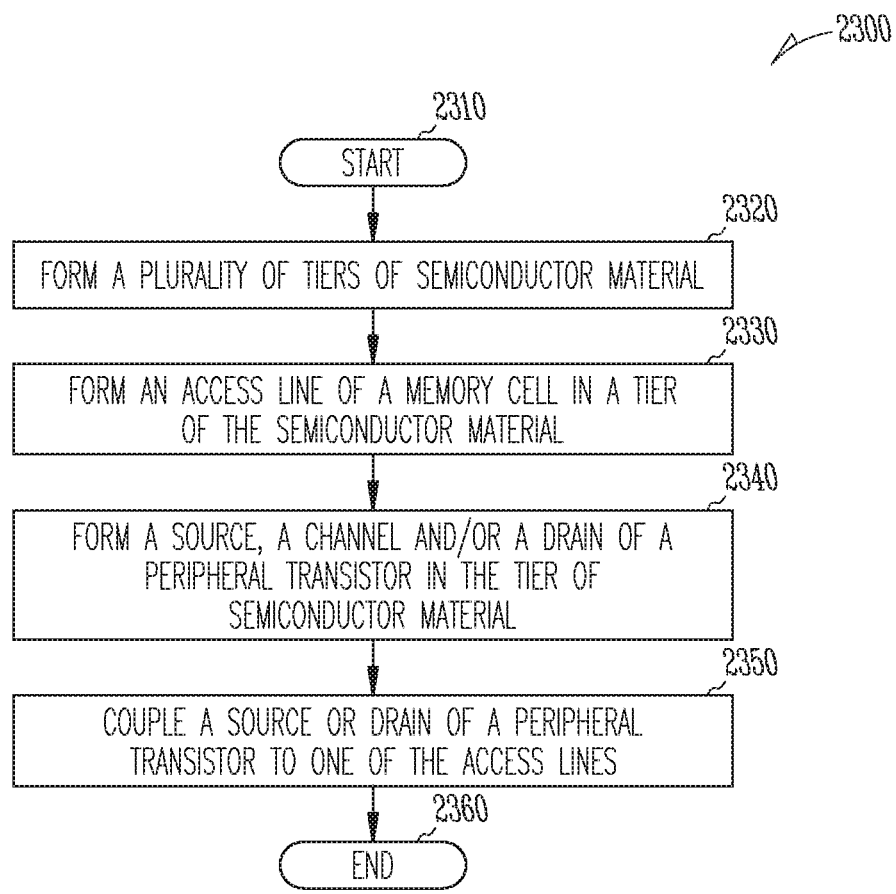
FIG. 23 is a flow diagram of methods according to various embodiments of the invention.

FIG. 23 is a flow diagram of methods 2300 according to various embodiments of the invention. In block 2310, the methods 2300 start. In block 2320, a plurality of tiers of semiconductor material, such as n-type polysilicon, are formed. In block 2330, an access line of a memory cell is formed in a tier of the semiconductor material (e.g., n-type polysilicon). In block 2340, a source, a channel and/or a drain of a peripheral transistor, such as a decoder transistor, are formed in the same tier of n-type polysilicon. This process can be repeated for each tier. In block 2350, a source or drain of a peripheral transistor is coupled to one of the access lines. In block 2360, the methods 2300 end. Various embodiments may have more or fewer activities than those shown in FIG. 23. In some embodiments, the activities may be repeated, substituted one for another, and/or performed in serial or parallel fashion.

Figure 24:
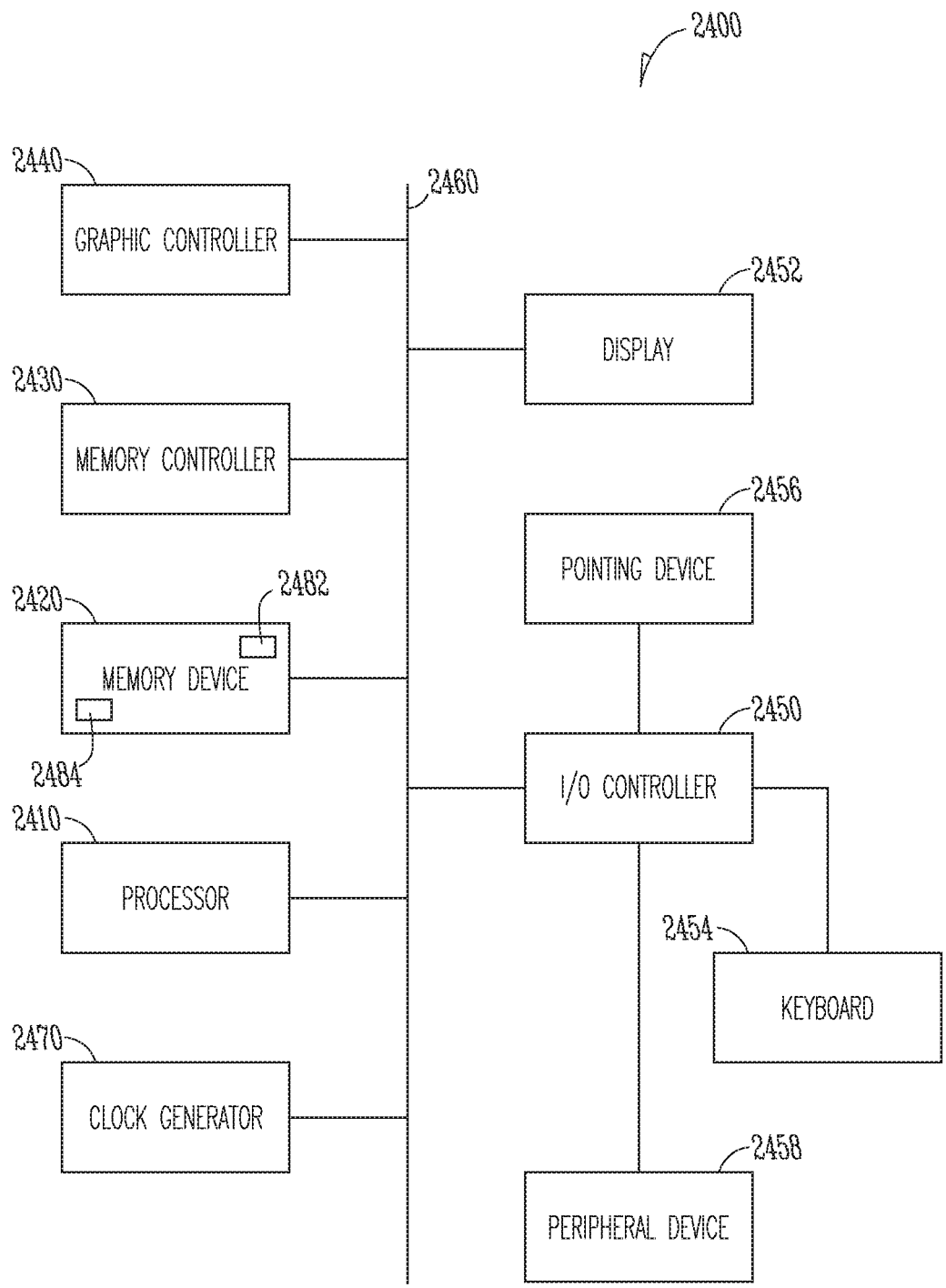
FIG. 24 is a diagram illustrating a system according to various embodiments of the invention.

FIG. 24 is a diagram illustrating a system 2400 according to various embodiments of the invention. The system 2400 may include a processor 2410, a memory device 2420, a memory controller 2430, a graphic controller 2440, an input and output (I/O) controller 2450, a display 2452, a keyboard 2454, a pointing device 2456, and a peripheral device 2458. A bus 2460 couples all of these devices together. A clock generator 2470 is coupled to the bus 2460 to provide a clock signal to at least one of the devices of the system 2400 through the bus 2460. The clock generator 2470 may include an oscillator in a circuit board such as a motherboard. Two or more devices shown in system 2400 may be formed in a single integrated circuit chip. The memory device 2420 may comprise one of the memory devices 100, 1700, 2100 or 2200 described herein and shown in the figures according to various embodiments of the invention. The memory device 2420 may comprise a semiconductor construction 2482 or 2484 such as, for example, one or more of the semiconductor constructions 200, 1300, 1400 and 1800 described herein and shown in the figures according to various embodiments of the invention. The bus 2460 may be interconnect traces on a circuit board or may be one or more cables. The bus 2460 may couple the devices of the system 2400 by wireless means such as by electromagnetic radiations, for example, radio waves. The peripheral device 2458 coupled to the I/O controller 2450 may be a printer, an optical device such as a CD-ROM and a DVD reader and writer, a magnetic device reader and writer such as a floppy disk driver, or an audio device such as a microphone.

The system 2400 represented by FIG. 24 may include computers (e.g., desktops, laptops, hand-fields, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Example structures and methods of fabricating semiconductor devices have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:
1. A method of forming a memory structure, comprising:
   forming multiple vertically arranged tiers, each tier comprising an access line of a respective group of memory cells, each tier also including at least one of a source, a channel, and a drain of a respective peripheral transistor; and forming multiple pillars comprising semiconductor material extending vertically through the multiple vertically arranged tiers, a first pillar of the multiple pillars comprising at least one of a source, a channel and a drain of each of multiple memory cells, and a second pillar of the multiple pillars comprising a gate of at least one peripheral transistor.

2. The method of claim 1, wherein the first pillar comprises a first semiconductor material; and wherein the multiple vertically arranged tiers each comprise a second semiconductor material.

3. The method of claim 2, wherein the multiple vertically arranged tiers each comprise the second semiconductor material in a first region, and further comprise a metal in a second region.

4. The method of claim 3, wherein the at least one of a source, a channel, and a drain of a respective peripheral transistor is formed of the second semiconductor material in the first region, and wherein the access lines are formed of the metal in the second region.

5. The method of claim 2, further comprising:
forming a slot through the tiers of the second semiconductor material to separate a first portion of the tiers of the second semiconductor material that includes a first group of memory cells from a second portion of the tiers of the second semiconductor material that includes a second group of memory cells.

6. The method of claim 5, wherein the first pillar is a U-shaped pillar extending through respective memory cells of the first and second groups.

7. The method of claim 5, further comprising:
forming a slot through the tiers of semiconductor material to separate a first portion of the tiers of semiconductor material including the portions of the memory cells from a second portion of the tiers of the semiconductor material including the portions of the peripheral transistors;
forming the first portion of the tiers of semiconductor material into a first staircase configuration; and
forming the second portion of the tiers of semiconductor material into a second staircase configuration.

8. The method of claim 5, further comprising:
forming a slot through the tiers of semiconductor material to separate a first portion of the tiers of semiconductor material including the portions of the memory cells from a second portion of the tiers of the semiconductor material including the portions of the decoder transistors; and
forming a plurality of pillars of semiconductor material to extend through a plurality of the tiers of semiconductor material, each pillar of semiconductor material comprising either a source, a channel and/or a drain of at least one of the memory cells, or a gate of at least one of the decoder transistors.

9. The method of claim 5, further comprising coupling a respective one of the portions of a memory cell to a respective one of the portions of a peripheral transistor.

10. The method of claim 5, wherein forming a plurality of tiers of a semiconductor material comprises:
forming a plurality of tiers of n-type polysilicon; and
forming silicon dioxide between the tiers of n-type polysilicon.

11. The method of claim 1, wherein each access line is formed coupled to one of the source and the drain of a respective peripheral transistor of the multiple peripheral transistors.

12. A method comprising:
forming multiple vertically-spaced tiers of a semiconductor material;
forming a respective portion of respective memory cells in at least two of the tiers of the semiconductor material, including forming a respective access line of the respective memory cells in the respective tier of semiconductor material; and
forming a respective portion of respective peripheral transistors in at least two of the tiers of the semiconductor material, including forming at least one of a respective source, channel and drain of the peripheral transistor in each tier of semiconductor material.

13. The method of claim 12, wherein the peripheral transistor formed with at least one of a respective source, channel and drain in each tier of two tiers of a semiconductor material is a decoder transistor.

* * * * *